(12) United States Patent
Saito et al.

(10) Patent No.: US 7,759,732 B2
(45) Date of Patent: Jul. 20, 2010

(54) POWER SEMICONDUCTOR DEVICE

(75) Inventors: Wataru Saito, Kanagawa-ken (JP);
Syotaro Ono, Kanagawa-ken (JP);
Masakatsu Takashita, Kanagawa-ken (JP); Yasuto Sumi, Kanagawa-ken (JP);
Masaru Izumisawa, Kanagawa-ken (JP); Hiroshi Ohta, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 11/680,912

(22) Filed: Mar. 1, 2007

(65) Prior Publication Data
US 2007/0272977 A1 Nov. 29, 2007

(30) Foreign Application Priority Data
Mar. 29, 2006 (JP) ............................ 2006-092406

(51) Int. Cl.
*H01L 27/088* (2006.01)
*H01L 23/62* (2006.01)

(52) U.S. Cl. .................. 257/341; 257/355; 257/401; 257/E21.418; 257/335

(58) Field of Classification Search .............. 257/328, 257/329, 341, 110, 339, 192, 302, E51.004, 257/E31.085, E29.183, E29.188, E29.242, 257/E29.198, E29.257, E29.262, E29.274, 257/E21.375, E21.383, E21.4, 425, 171, 257/483, 342, 502, E21.38, 129, 168; 438/268
See application file for complete search history.

(56) References Cited

U.S. PATENT DOCUMENTS

| 6,611,021 B1 * | 8/2003 | Onishi et al. ............... 257/328 |
| 6,693,338 B2 | 2/2004 | Saitoh et al. |
| 6,700,141 B2 * | 3/2004 | Iwamoto et al. ............. 257/110 |
| 6,844,592 B2 | 1/2005 | Yamaguchi et al. |

(Continued)

FOREIGN PATENT DOCUMENTS

JP 2000-277726 10/2000

(Continued)

OTHER PUBLICATIONS

Fujihira. Theory of Semiconductor Superjunction Devices. Jpn. J. Appl. Phys. vol. 36 (1997), pp. 6254-6262.*

(Continued)

*Primary Examiner*—Lynne A Gurley
*Assistant Examiner*—Galina Yushina
(74) *Attorney, Agent, or Firm*—Oblon, Spivak, McClelland, Maier & Neustadt, L.L.P.

(57) ABSTRACT

A power semiconductor device includes: a first semiconductor layer of a first conductivity type; a second semiconductor layer of the first conductivity type and a third semiconductor layer of a second conductivity type formed on the first semiconductor layer and alternately arranged along at least one direction parallel to a surface of the first semiconductor layer; a first main electrode; a fourth semiconductor layer of the second conductivity type selectively formed in a surface of the second semiconductor layer and a surface of the third semiconductor layer; a fifth semiconductor layer of the first conductivity type selectively formed in a surface of the fourth semiconductor layer; a second main electrode; and a control electrode. At least one of the second and the third semiconductor layers has a dopant concentration profile along the one direction, the dopant concentration profile having a local minimum at a position except both ends thereof.

9 Claims, 26 Drawing Sheets

U.S. PATENT DOCUMENTS

| | | | |
|---|---|---|---|
| 6,888,195 B2 * | 5/2005 | Saito et al. ................. | 257/328 |
| 6,919,610 B2 | 7/2005 | Saitoh et al. | |
| 2002/0167020 A1 * | 11/2002 | Iwamoto et al. ............ | 257/110 |
| 2004/0043565 A1 * | 3/2004 | Yamaguchi et al. ........ | 438/268 |
| 2004/0238844 A1 | 12/2004 | Tokano et al. | |
| 2005/0184336 A1 | 8/2005 | Takahashi et al. | |
| 2006/0043478 A1 * | 3/2006 | Yamaguchi et al. ........ | 257/339 |
| 2006/0197152 A1 | 9/2006 | Tokano et al. | |

FOREIGN PATENT DOCUMENTS

| | | | |
|---|---|---|---|
| JP | 2001-298191 | * | 10/2001 |
| JP | 2004-134714 | | 4/2004 |

OTHER PUBLICATIONS

U.S. Appl. No. 12/123,072, filed May 19, 2008, Ono, et al.
U.S. Appl. No. 12/138,875, filed Jun. 13, 2008, Saito, et al.
U.S. Appl. No. 12/243,280, filed Oct. 1, 2008, Ono, et al.

* cited by examiner

POWER SEMICONDUCTOR DEVICE

CROSS-REFERENCE TO RELATED APPLICATIONS

This application is based upon and claims the benefit of priority from the prior Japanese Patent Application No. 2006-092406, filed on Mar. 29, 2006; the entire contents of which are incorporated herein by reference.

BACKGROUND OF THE INVENTION

1. Field of the Invention

This invention relates to a power semiconductor device, and more particularly to a power semiconductor device having a superjunction structure.

2. Background Art

The ON resistance of a vertical power MOSFET (Metal Oxide Semiconductor Field Effect Transistor) greatly depends on the electric resistance of its conduction layer (drift layer). The dopant concentration that determines the electric resistance of the drift layer cannot exceed a maximum limit, which depends on the breakdown voltage required for a pn junction formed by the base and the drift layer. Thus there is a tradeoff between the device breakdown voltage and the ON resistance. Improving this tradeoff is important for devices with low power consumption. This tradeoff has a limit determined by the device material. Overcoming this limit is the way to realizing devices with low ON resistance beyond existing power devices.

As an example MOSFET for solving this problem, a structure is known as a "superjunction structure", which is formed by p-pillar layers and n-pillar layers buried in the drift layer. In the superjunction structure, a non-doped layer is artificially produced by equalizing the amount of charge (amount of dopant) contained in the p-pillar layer and the n-pillar layer. Thus, with retaining high breakdown voltage, a current is allowed to flow through the highly doped n-pillar layer, thereby realizing low ON resistance beyond the material limit. For retaining high breakdown voltage, it is necessary to accurately control the amount of dopant in the n-pillar layer and the p-pillar layer.

In such a MOSFET with a superjunction structure formed in the drift layer, the design of the edge termination structure is also different from that of conventional power MOSFETs. Because the edge termination section as well as the device section needs to retain high breakdown voltage, the superjunction structure is usually formed also in the edge termination section. In this case, when the amount of dopant in the n-pillar layer is equal to that in the p-pillar layer, the breakdown voltage of the edge termination section decreases more significantly than that of the device section (cell section). Thus some structures have already been devised for increasing the breakdown voltage of the edge termination section to prevent the overall decrease of breakdown voltage. In one structure, the p/n-pillar concentration in the edge termination section is made lower than in the device section. In another structure, the arrangement period of pillar layers is narrowed (see JP 2001-298190A). On the other hand, in a different structure, for increasing the breakdown voltage of the edge termination section, the edge termination section is formed from a high-resistance layer without a superjunction structure (see JP 2000-277726A).

However, in any of these structures, the superjunction structure is discontinuous between the device section and the edge termination section. In this discontinuous portion, that is, in the outermost p-pillar layer or n-pillar layer of the superjunction structure of the device section, the dopant concentration must be decreased to about half that in the cell section. For realizing such dopant concentration of the pillar layer varied with position, the dose amount of ion implantation must be varied with position, or the opening width of the implantation mask must be varied. Varying the dose amount with position leads to decreased throughput such as implantation being divided into twice. On the other hand, varying the mask width can be easily realized by varying the lithography mask width. However, a conversion difference occurs between the lithography mask and the resist mask used for actual implantation. Dispersion in this conversion difference is equivalent to dispersion in the amount of dopant. Thus, unfortunately, the edge termination structure, which is promising for high breakdown voltage in principle, is difficult to realize and susceptible to process dispersion.

SUMMARY OF THE INVENTION

According to an aspect of the invention, there is provided a power semiconductor device having a cell section for passing current and an edge termination section surrounding the cell section, the power semiconductor device including: a first semiconductor layer of a first conductivity type; a second semiconductor layer of the first conductivity type and a third semiconductor layer of a second conductivity type formed on the first semiconductor layer of the first conductivity type in the cell section and alternately arranged along at least one direction parallel to a surface of the first semiconductor layer of the first conductivity type; a first main electrode electrically connected to the first semiconductor layer of the first conductivity type; a fourth semiconductor layer of the second conductivity type selectively formed in a surface of the second semiconductor layer of the first conductivity type and a surface of the third semiconductor layer of the second conductivity type; a fifth semiconductor layer of the first conductivity type selectively formed in a surface of the fourth semiconductor layer of the second conductivity type; a second main electrode connected to the fourth semiconductor layer of the second conductivity type and the fifth semiconductor layer of the first conductivity type; and a control electrode formed above the fourth semiconductor layer of the second conductivity type, the fifth semiconductor layer of the first conductivity type, and the second semiconductor layer of the first conductivity type via a gate insulating film, at least one of the second semiconductor layer of the first conductivity type and the third semiconductor layer of the second conductivity type having a dopant concentration profile along the one direction, the dopant concentration profile having a local minimum at a position except both ends thereof.

According to another aspect of the invention, there is provided a power semiconductor device having a cell section for passing current and an edge termination section surrounding the cell section, the power semiconductor device including: a first semiconductor layer of a first conductivity type; a second semiconductor layer of the first conductivity type and a third semiconductor layer of a second conductivity type formed on the first semiconductor layer of the first conductivity type in the cell section and alternately arranged along at least one direction parallel to a surface of the first semiconductor layer of the first conductivity type; a seventh semiconductor layer of the first conductivity type and an eighth semiconductor layer of the second conductivity type formed on the first semiconductor layer of the first conductivity type in the edge termination section and alternately arranged along the one direction; a first main electrode electrically connected to the first semiconductor layer of the first conductivity type; a fourth semiconductor layer of the second conductivity type selectively formed in a surface of the second semiconductor layer of the first conductivity type and a surface of the third semiconductor layer of the second conductivity type; a fifth semiconductor layer of the first conductivity type selectively formed in a surface of the fourth semiconductor layer of the second conductivity type; a second main electrode connected to the fourth semiconductor layer of the second conductivity type and the fifth semiconductor layer of the first conductivity type; and a control electrode formed above the fourth semiconductor layer of the second conductivity type, the fifth semiconductor layer of the first conductivity type, and the second semiconductor layer of the first conductivity type via a gate insulating film, in a region including a boundary between the cell section and the edge termination section and including three or more consecutively arranged semiconductor layers among the second semiconductor layer of the first conductivity type, the third semiconductor layer of the second conductivity type, the seventh semiconductor layer of the first conductivity type, and the eighth semiconductor layer of the second conductivity type, dopant concentration in each of the semiconductor layers being lower as the semiconductor layer is located nearer to the edge termination section.

DETAILED DESCRIPTION OF THE INVENTION

Figure 1:
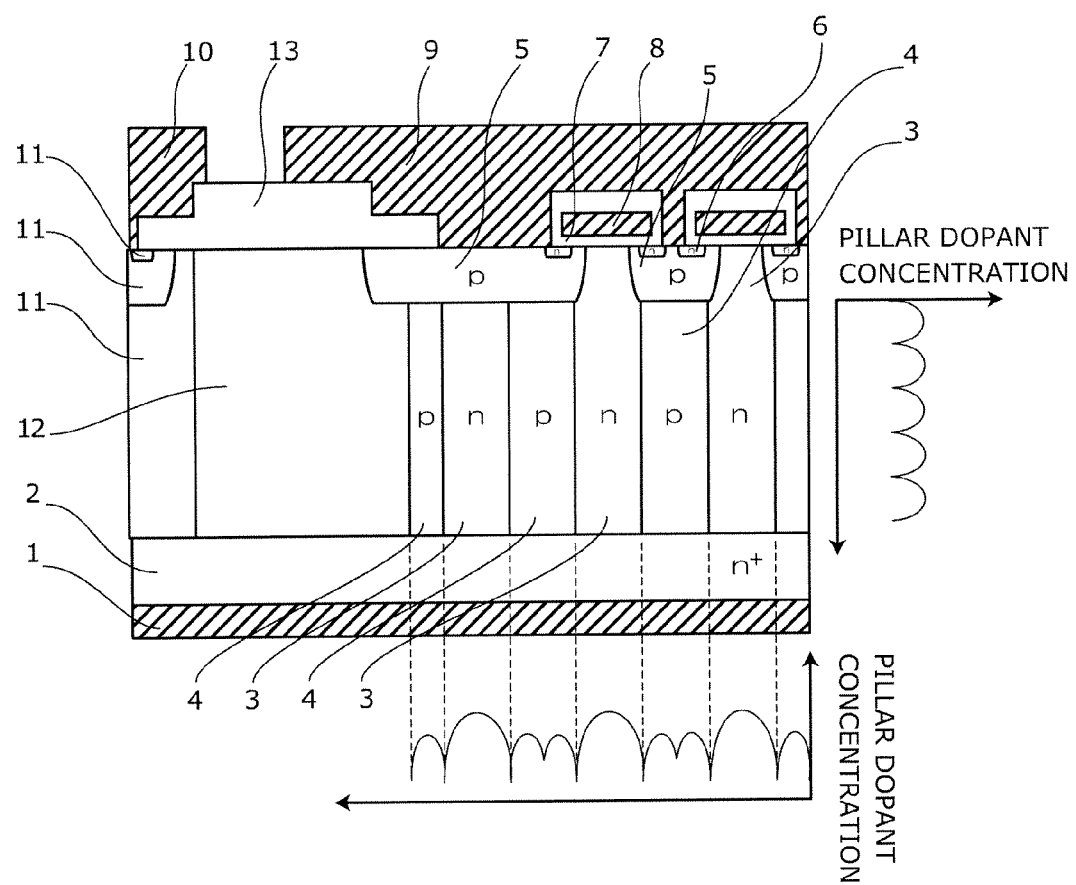
FIG. 1 is a cross-sectional view showing a vertical power MOSFET having a superjunction structure according to a first embodiment of the invention.

Embodiments of the invention will now be described with reference to the drawings. The following embodiments are illustrated assuming the first conductivity type as n-type and the second conductivity type as p-type. Like elements in the drawings are marked with like reference numerals.

First Embodiment

FIG. 1 is a cross-sectional view schematically showing the configuration of a power MOSFET according to a first embodiment of the invention. FIG. 1 also includes graphs for illustrating the dopant concentration profile of pillar layers, where the horizontal axis represents the position and the vertical axis represents the dopant concentration. This also applies to similar figures described below.

As shown in FIG. 1, the power semiconductor device according to this embodiment is a vertical MOSFET having a superjunction structure. In this vertical MOSFET, a cell section for passing current is provided at the center of the device, and an edge termination section surrounding the cell section is provided on the periphery of the device. The outer periphery of the cell section is curved at its corners. In the cell section located at the device center of this MOSFET, an $n^+$-drain layer 2 is formed as a first semiconductor layer. On this $n^+$-drain layer 2, n-pillar layers 3 serving as a second semiconductor layer and p-pillar layers 4 serving as a third semiconductor layer are alternately formed along the direction parallel to the surface of the $n^+$-drain layer 2. The n-pillar layers 3 and the p-pillar layers 4 constitute a so-called superjunction structure. A drain electrode 1 serving as a first main electrode is formed on the lower face of the n+-drain layer 2.

In part of the surface of the superjunction structure of the cell section, p-type base layers 5 are selectively formed as a fourth semiconductor layer in a striped configuration. In part of the surface of this p-base layer 5, n-source layers 6 are selectively formed as a fifth semiconductor layer in a striped configuration. On a region extending from one p-type base layer 5 and an n-source layer 6 formed in the surface thereof through an n-pillar layer 3 to another p-type base layer 5 and an n-source layer 6 formed in the surface thereof, a gate electrode 8 is formed as a first control electrode in a striped configuration via a gate insulating film 7, e.g. Si oxide film, having a film thickness of e.g. about 0.1 μm. Sandwiching this gate electrode 8, a source electrode 9 is formed as a second control electrode in a striped configuration on the one p-type base layer 5 and n-source layer 6 and on the other p-base layer 5 and n-source layer 6.

On the other hand, in the device edge termination section, a high-resistance layer 12 is formed on the n+-drain layer 2. A field insulating film 13 is formed on the surface of the high-resistance layer 12. The source electrode 9 is formed on the field insulating film 13. Thus the decrease of breakdown voltage in the edge termination section is prevented by the field plate effect. By forming a high-resistance (low-doped) layer instead of a superjunction structure in the edge termination section, the depletion layer is easy to extend, and a higher edge termination breakdown voltage than that in the cell section can be achieved. In FIG. 1, the field plate electrode is integrally formed with the source electrode 9. However, the field plate electrode may alternatively be connected to the gate electrode 8.

In the device outermost portion, a field stop electrode 10 and a field stop layer 11 are formed to prevent the depletion layer from reaching the dicing line upon application of high voltage. The field stop electrode 10 can be formed simultaneously with the source electrode. The field stop layer 11 can be formed simultaneously with the n-pillar layer 3, the p-base layer 5, and the n-source layer 6.

By way of example, the distance between the outermost p-base layer 5 and the field stop layer 11 is 100 to 150 μm. The thickness of the high-resistance layer 12, that is, the distance from the lower face of the field insulating film 13 to the upper face of the n+-drain layer 2, is 50 μm. Thus the total thickness of the high-resistance layer 12 and the n+-drain layer 2 is 200 to 250 μm. The overall planar configuration of the MOSFET is illustratively a square measuring 3 to 5 mm on a side, and the curvature radius of the outer periphery of the outermost p-base layer 5 is 100 to 200 μm.

The width of the outermost p-pillar layer 4 of the superjunction structure, that is, the p-pillar layer 4 in contact with the high-resistance layer 12 of the device edge termination section (hereinafter referred to as "outermost p-pillar layer"), is shown as half the width of the other p-pillar layers 4 (hereinafter referred to as "cell p-pillar layers"). This indicates that the amount of dopant in the outermost p-pillar layer is half the amount of dopant in the cell p-pillar layer 4. In the superjunction structure, the depletion layer extends from the junction interface between the n-pillar layer and the p-pillar layer, and the drift layer is completely depleted at a low voltage. The cell p-pillar layer 4 has n-pillar layers on both sides thereof, and hence the depletion layers extend from both sides. However, the outermost p-pillar layer has an n-pillar layer 3 only on one side thereof, and the other side is occupied by the high-resistance layer 12. Thus the depletion layer in the outermost p-pillar layer extends only from the n-pillar layer 3 side. Therefore the amount of dopant in the outermost p-pillar layer must be half that in the cell p-pillar layer 4.

In the superjunction structure, when the amount of dopant in the n-pillar layer 3 is made equal to that in p-pillar layer 4, the charge in the completely depleted drift layer vanish, and the electric field distribution flattens, thereby realizing high breakdown voltage. Hence, if there is an unequal amount of dopant, the charge due to extra donor or acceptor ions provides a sloped electric field distribution even in the completely depleted drift layer. Thus the breakdown voltage decreases. If the amount of dopant in the outermost p-pillar layer is not half the amount of dopant in the cell p-pillar layer, the amount of dopant in the outermost p-pillar layer is not equal to that in the n-pillar layer 3 in contact therewith, and locally enhances the electric field. Thus the breakdown voltage decreases.

The superjunction structure can be formed by a process of repeating ion implantation and buried growth. In the process of this embodiment, ion implantation of dopant for both the n-pillar layer 3 and the p-pillar layer 4 and growth of the high-resistance layer are repeated. In this process, by using a mask pattern that prevents dopant implantation in the edge termination section, it is possible to form a structure where the superjunction structure is formed in the cell section and not formed in the edge termination section. The amount of dopant in the pillar layer can be controlled by the dose amount and the mask opening width in ion implantation. The amount of dopant in the outermost pillar layer can be decreased to half that in the cell section by decreasing the mask opening width by half. However, a resist is typically used as a mask, and dimensional dispersion of the resist is likely to occur due to the dimensional conversion difference between the resist mask and the photolithography mask. Thus it is difficult to accurately decrease the amount of dopant in the outermost pillar layer to half that in the cell section.

However, in this embodiment, such dispersion is prevented using an ingenious pattern of n-pillar layers 3 and p-pillar layers 4. As described earlier, in the superjunction structure under a low voltage, depletion layers extend from both junction interfaces between the p-pillar layer 4 and the n-pillar layer 3. The depletion layers that have extended are connected together at the center of the pillar layer to cause complete depletion. That is, the basic unit of the superjunction structure is not a pair of an n-pillar layer 3 and a p-pillar layer 4 adjacent to each other, that is, not the portion extending from the end of the p-pillar layer 4 to the end of the n-pillar layer 3, but extends from the center of a p-pillar layer 4 through an n-pillar layer 3 to the center of an adjacent p-pillar layer 4, or from the center of an n-pillar layer 3 through a p-pillar layer 4 to the center of an adjacent n-pillar layer 3. If the pattern of the pillar layers is such that pillar layers are formed using this basic unit, then the pattern does not have locally varied dimensions, and the dimensional dispersion is the same as the overall one. Thus the amount of dopant does not extremely vary in the pillar layer (outermost pillar layer) at the boundary (outermost portion) with the edge termination section.

Figure 2:
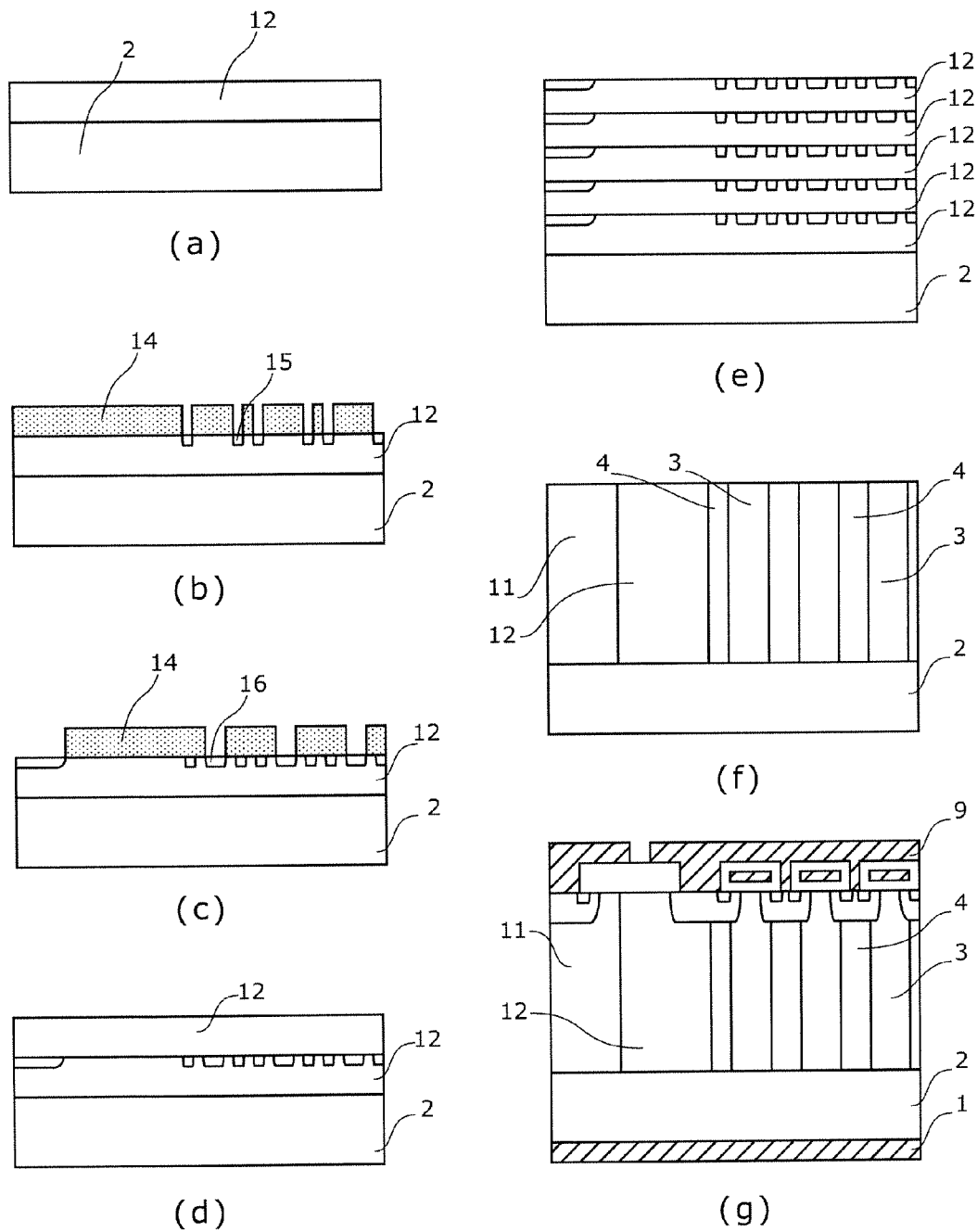
FIGS. 2A to 2G are cross-sectional views showing a method for manufacturing a vertical power MOSFET according to the first embodiment.

The process flow and the resist mask pattern in this embodiment are described with reference to FIGS. 2 and 3.

FIGS. 2A to 2G are cross-sectional views showing a method for manufacturing a vertical power MOSFET according to the first embodiment.

First, as shown in FIG. 2A, a high-resistance layer 12 is formed on a substrate serving as an n+-drain layer 2. Next, as shown in FIG. 2B, a resist 14 is used as a mask to implant boron 15 in the surface of this substrate. Next, as shown in FIG. 2C, a resist mask 14 for forming n-pillar layers 3 is formed, and then phosphorus 16 is implanted. Next, as shown in FIG. 2D, a high-resistance layer 12 is buried in the doped layer. Subsequently, the process shown in FIGS. 2A to 2D is repeated a plurality of times to laminate a plurality of doped layers on the n⁺-drain layer 2 as shown in FIG. 2E. Then, by thermal diffusion, as shown in FIG. 2F, the buried doped layer are connected to each other to form a vertically elongated n-pillar layers 3 and p-pillar layers 4. Then, as shown in FIG. 2G, a MOS process is conducted to complete the device.

Figure 3:
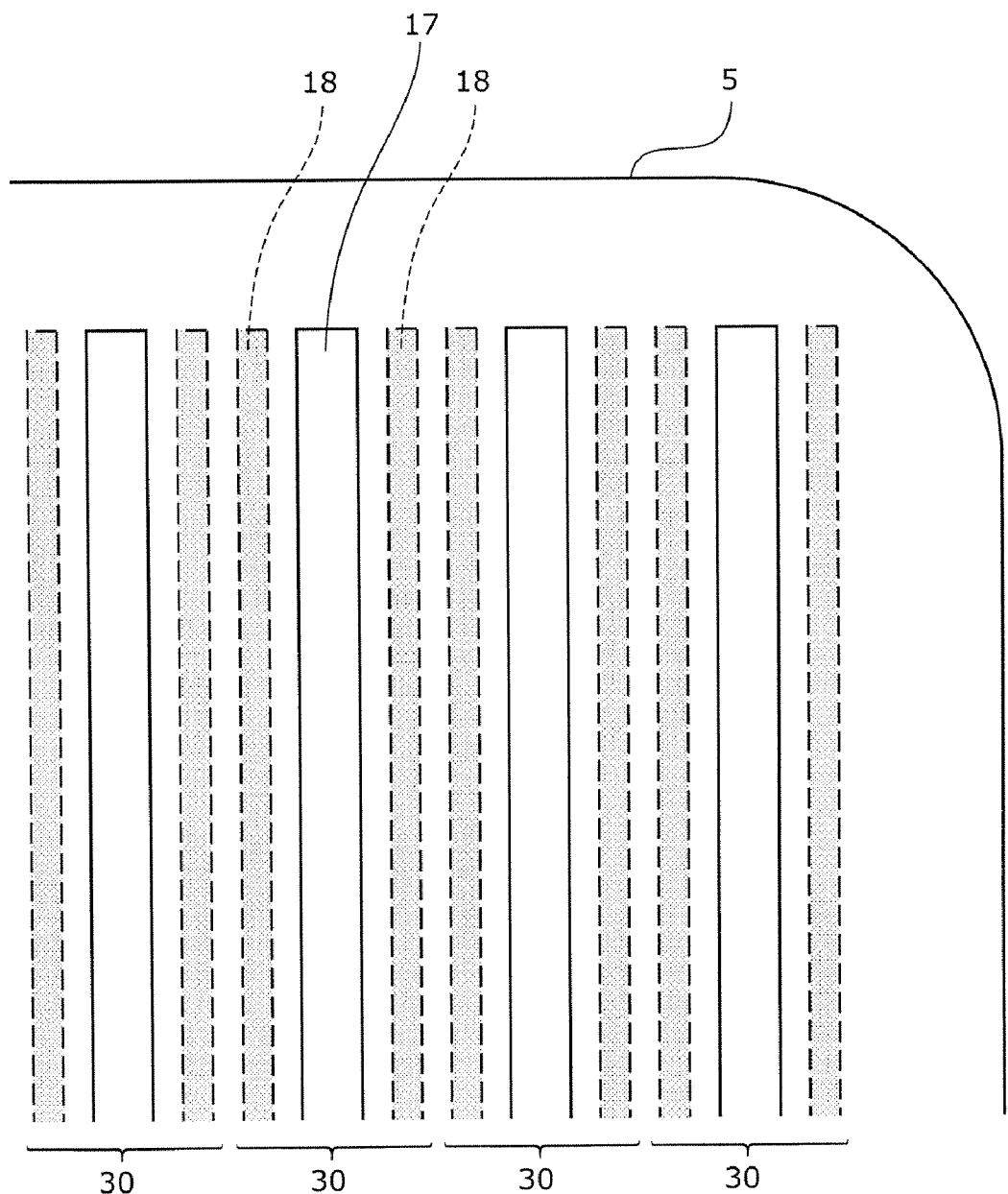
FIG. 3 shows a mask pattern for forming pillar layers of a vertical power MOSFET according to the first embodiment.

FIG. 3 shows a mask pattern for forming pillar layers of a vertical power MOSFET according to the first embodiment.

The mask pattern for forming n-pillar layers 3 and p-pillar layers 4 is as shown in FIG. 3, where the mask for forming n-pillar layers and the mask for forming p-pillar layers are shown in superposition for convenience. The figure also shows a curve corresponding to the outer periphery of the outermost p-base layer 5 (see FIG. 1) for clarifying how the positions where n-pillar layers 3 and p-pillar layers 4 are formed are relatively related to the position where the p-base layer 5 is formed. This also applies to the figures of other mask patterns described below.

In the pattern shown in FIG. 3, p-pillar layer openings 18 are arranged so as to sandwich an n-pillar layer opening 17 for forming an n-pillar layer 3. By using such arrangement, the basic unit of the superjunction structure, which extends from the center of a p-pillar layer to the center of an adjacent p-pillar layer, is formed by the three openings. That is, the basic unit 30 shown in FIG. 3 corresponds to the basic unit for forming the superjunction structure of the MOSFET according to this embodiment, and the basic units 30 are juxtaposed. Then, with regard to cell p-pillar layers, adjacent p-pillar layers are connected to each other to form a profile with a valley in the horizontal profile as shown in FIG. 1. That is, the dopant concentration profile of each p-pillar layer 4 in the arranging direction of the n-pillar layers 3 and the p-pillar layers 4 has a local minimum at a position other than both ends of the p-pillar layer 4, e.g., at the center of the p-pillar layer 4. Then, without varying the pattern at the boundary with the edge termination section, the amount of dopant in the outermost pillar layer is half the amount of dopant in the cell pillar layer. Because the mask opening width in the cell section is the same as in the boundary section, the opening dispersion is uniform in the device, and no local dispersion occurs. Thus, high breakdown voltage can be stably realized.

Thus, according to this embodiment, the (p-pillar layer/n-pillar layer/p-pillar layer) structure or (n-pillar layer/p-pillar layer/n-pillar layer) structure serving as a basic unit for the superjunction structure of the cell section is integrally formed. Hence, even if there is a discontinuous region between the device section and the edge termination section, the arrangement pattern of the basic unit can be adapted to obtain an ideal concentration variation, and high breakdown voltage can be realized in the edge termination section. Consequently, it is possible to obtain a MOSFET having a superjunction structure where the decrease of breakdown voltage due to process dispersion is reduced, and to increase the dopant concentration in the superjunction structure. Thus the ON resistance can be reduced.

In the pattern shown in FIG. 3, p-pillar layer openings 18 sandwich an n-pillar layer opening 17. However, it is also possible to use an arrangement where n-pillar layer openings 17 sandwich a p-pillar layer opening 18. In this case, a valley occurs in the horizontal profile of the n-pillar layer 3. That is, the dopant concentration profile of each n-pillar layer 3 has a local minimum at a position other than both ends of the n-pillar layer 3.

Figure 4:
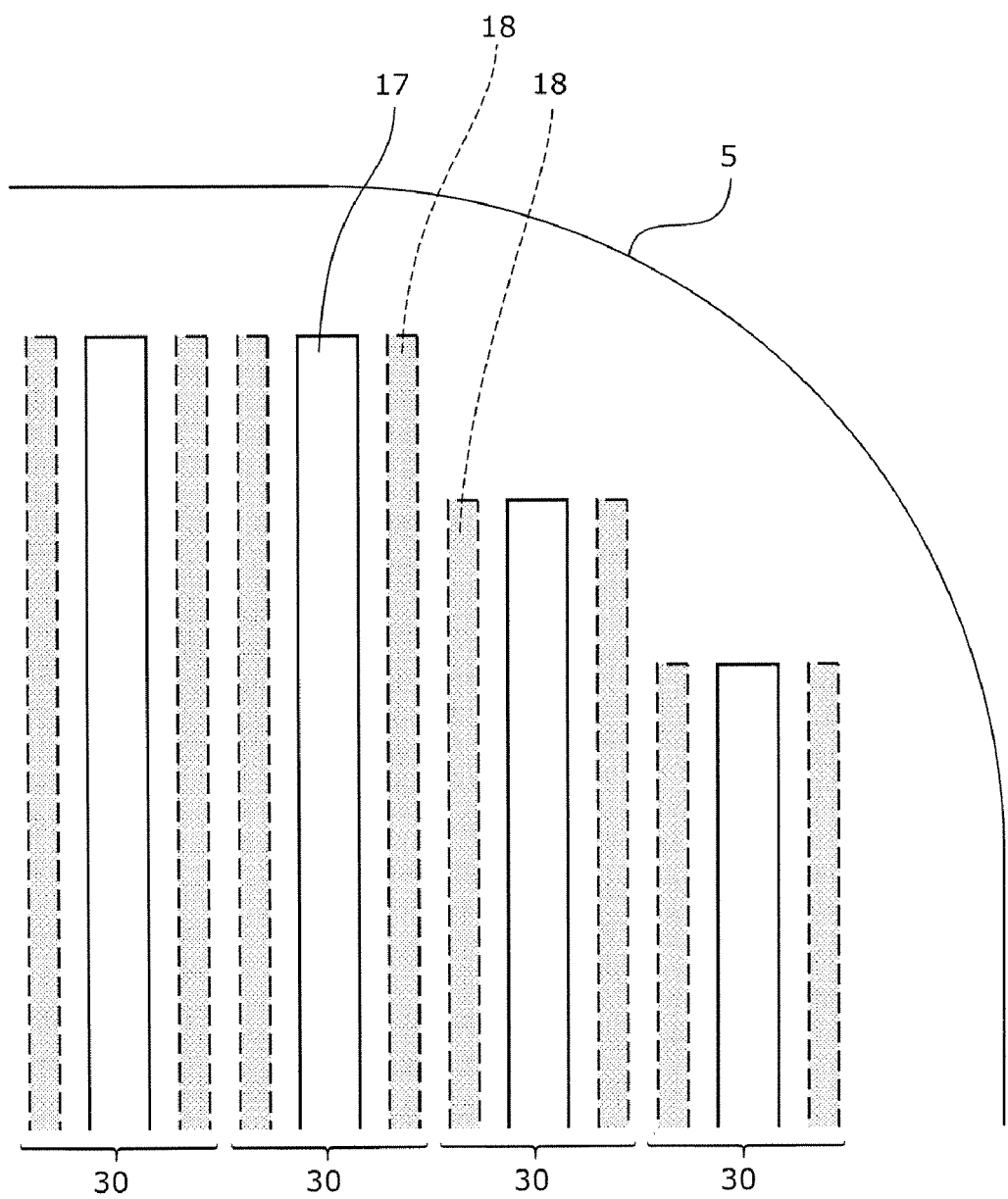
FIG. 4 shows a mask pattern for forming pillar layers of a vertical power MOSFET according to a modification of the first embodiment.

FIG. 4 shows a modification of the pattern. The end portion of the p-base layer 5 in the device edge termination section is susceptible to electric field concentration. Hence the corner needs to have a pattern with a large curvature radius. For preventing electric field concentration at the corner, the superjunction structure needs to be formed inside the corner. If the superjunction structure is formed in a quadrangular configuration inside the corner, the area occupied by the superjunction structure decreases. Then the effective area of the device decreases, and the ON resistance increases. Thus the superjunction structure also needs to have a curved configuration depending on the curvature of the p-base layer 5.

However, if the n-pillar layers 3 and the p-pillar layers 4 are independently provided with a curved configuration, the amount of dopant is locally unbalanced, and the breakdown voltage decreases. Hence, for preventing the decrease of breakdown voltage, as shown in FIG. 4, the configuration of the n-pillar layers 3 and the p-pillar layers 4 as viewed from above is shaped along the curved outer periphery of the outermost p-base layer 5 so as to vary stepwise the arrangement of basic units. Thus the superjunction structure can be formed without decreasing the effective area and without unbalancing the amount of dopant.

Figure 5:
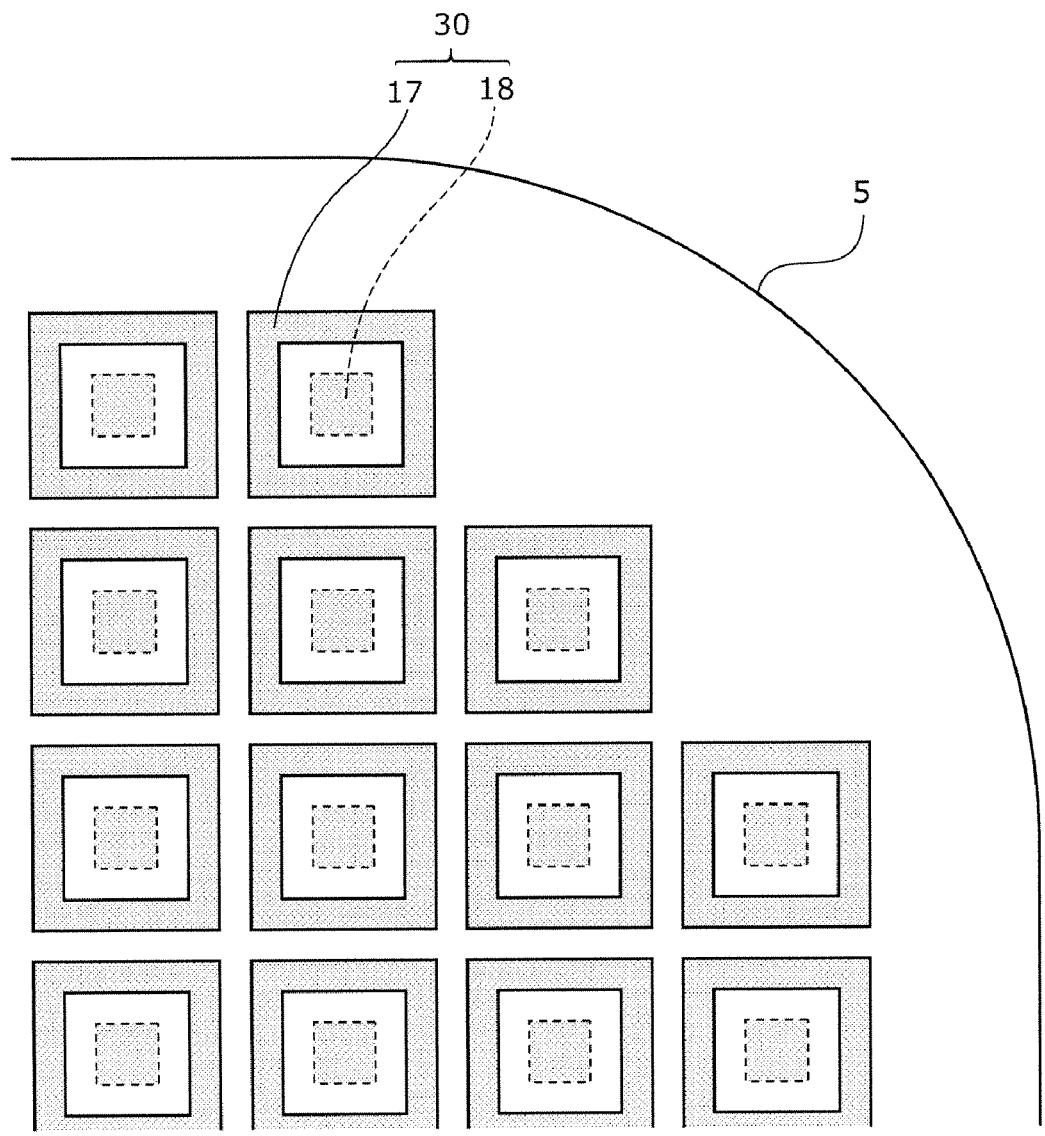
FIG. 5 shows a mask pattern for forming pillar layers of a vertical power MOSFET according to another modification of the first embodiment.

FIG. 5 shows another modification. The foregoing examples illustrate patterns for forming a superjunction structure in a striped configuration. In contrast, FIG. 5 shows a pattern where p-pillar layers 3 are arranged in a matrix configuration. That is, an annular n-pillar layer opening 17 is formed so as to surround an island-shaped p-pillar layer opening 18. Such a pattern can be used to integrally form the basic unit, which extends from the center of an n-pillar layer 3 to the center of an adjacent n-pillar layer 3. The pattern, which is arranged in a matrix configuration, can be configured equivalently in two directions orthogonal to each other and parallel to the surface of the device. It is also possible to omit the superjunction structure at the corner.

Figure 6:
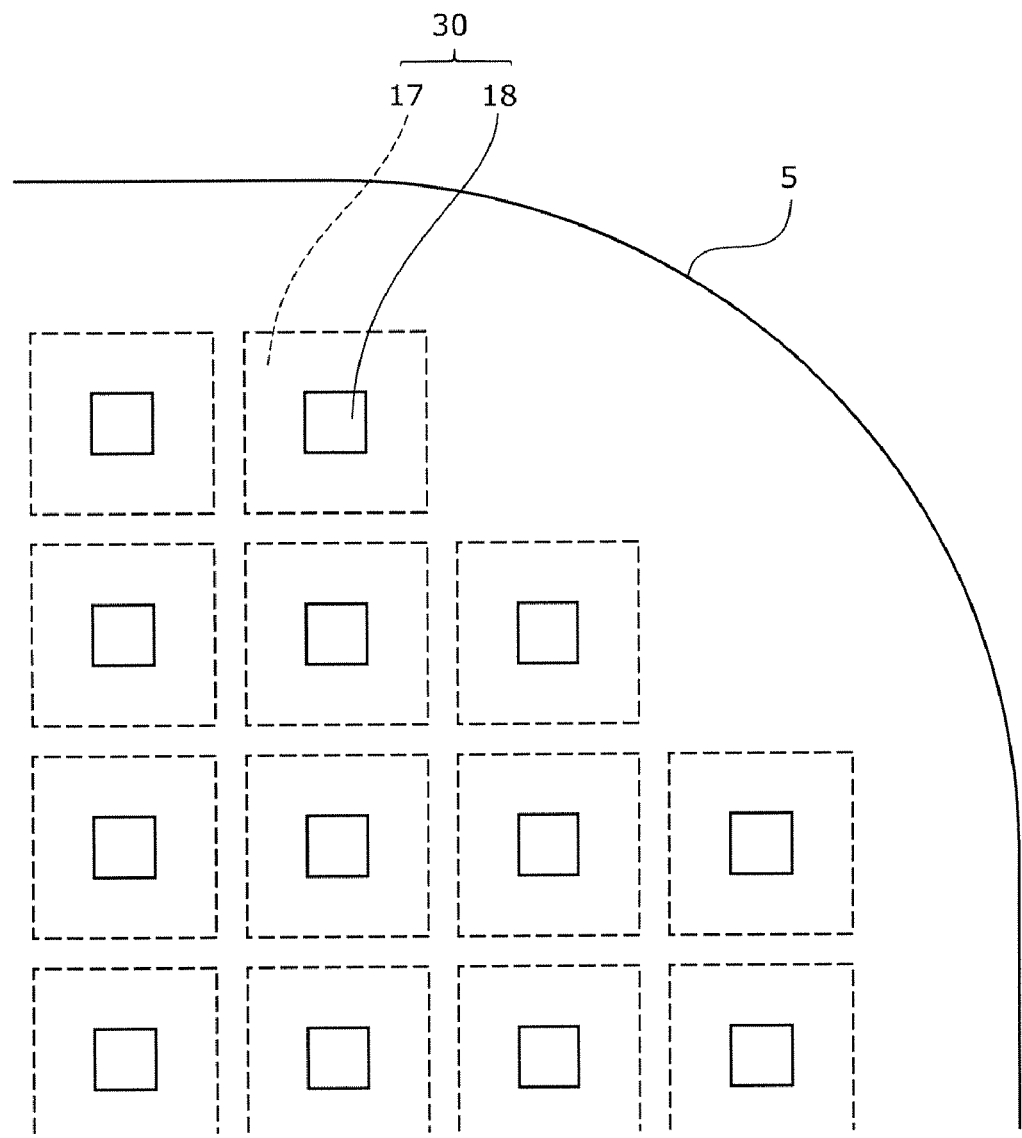
FIG. 6 shows a mask pattern for forming pillar layers of a vertical power MOSFET according to still another modification of the first embodiment.

FIG. 6 shows another modification. In FIG. 5, an annular n-pillar layer opening 17 is formed so as to surround an island-shaped p-pillar layer opening 18. In contrast, in the pattern shown in FIG. 6, a small island-shaped p-pillar layer opening 18 is formed in a large island-shaped n-pillar layer opening 17. In such a pattern, both the n-type dopant (phosphorus) and the p-type dopant (boron) are implanted into the portion where the patterns are overlapped. Hence a larger amount of p-type dopant needs to be implanted into the portion so as to previously cancel the n-type dopant. However, because the area of the n-pillar layer opening increases, the area variation due to dispersed pattern dimensions decreases. Thus the influence of process dispersion can be reduced.

Figure 7:
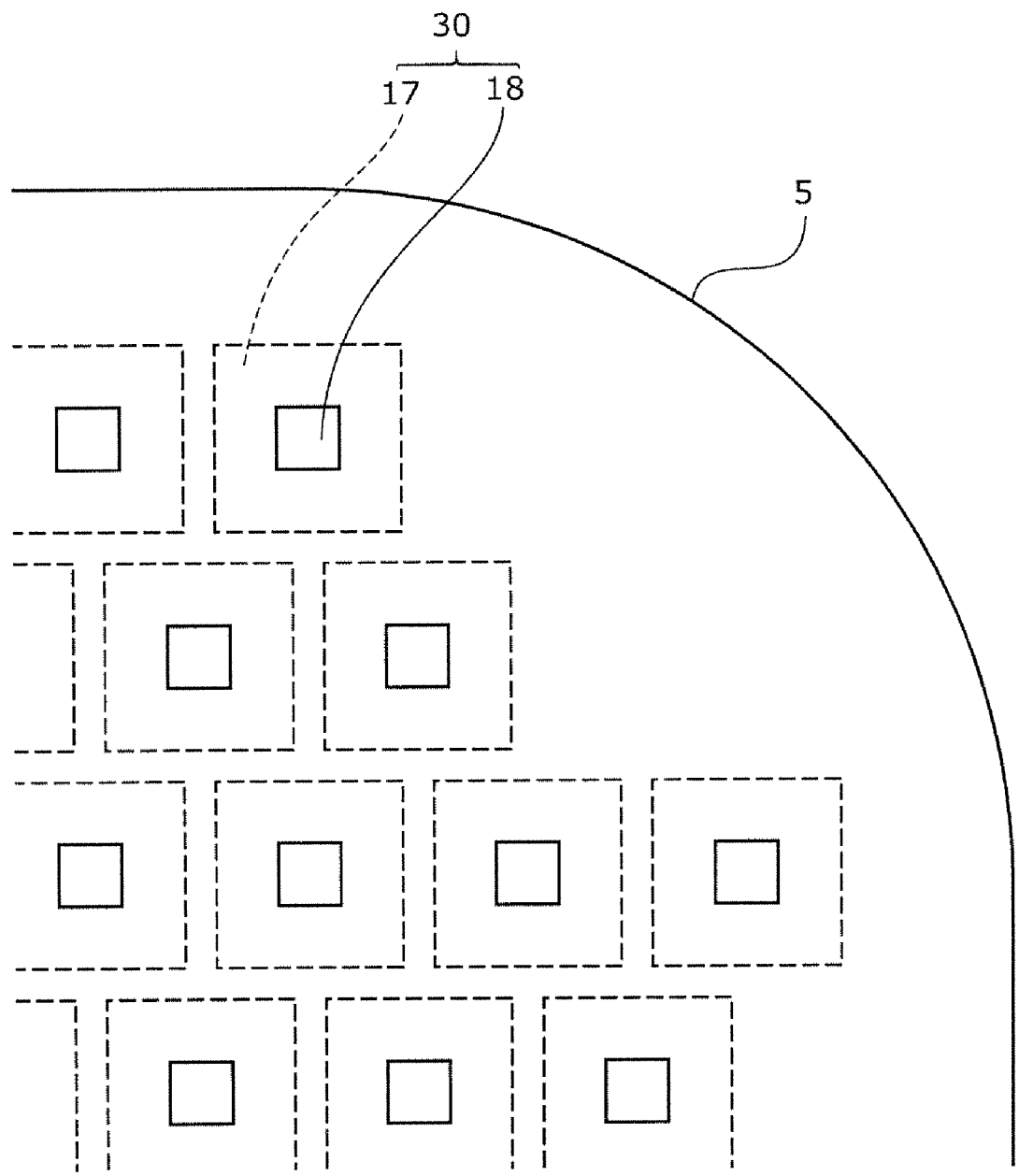
FIG. 7 shows a mask pattern for forming pillar layers of a vertical power MOSFET according to still another modification of the first embodiment.

FIG. 7 shows still another modification. Such a pattern as shown in FIG. 7 can be used to form a superjunction structure where p-pillar layers 4 are arranged in a staggered configuration. As illustrated in the foregoing patterns, the pattern is arranged using basic units. Thus the pattern of the superjunction structure can be freely changed without varying the pattern dimensions.

Second Embodiment

Figure 8:
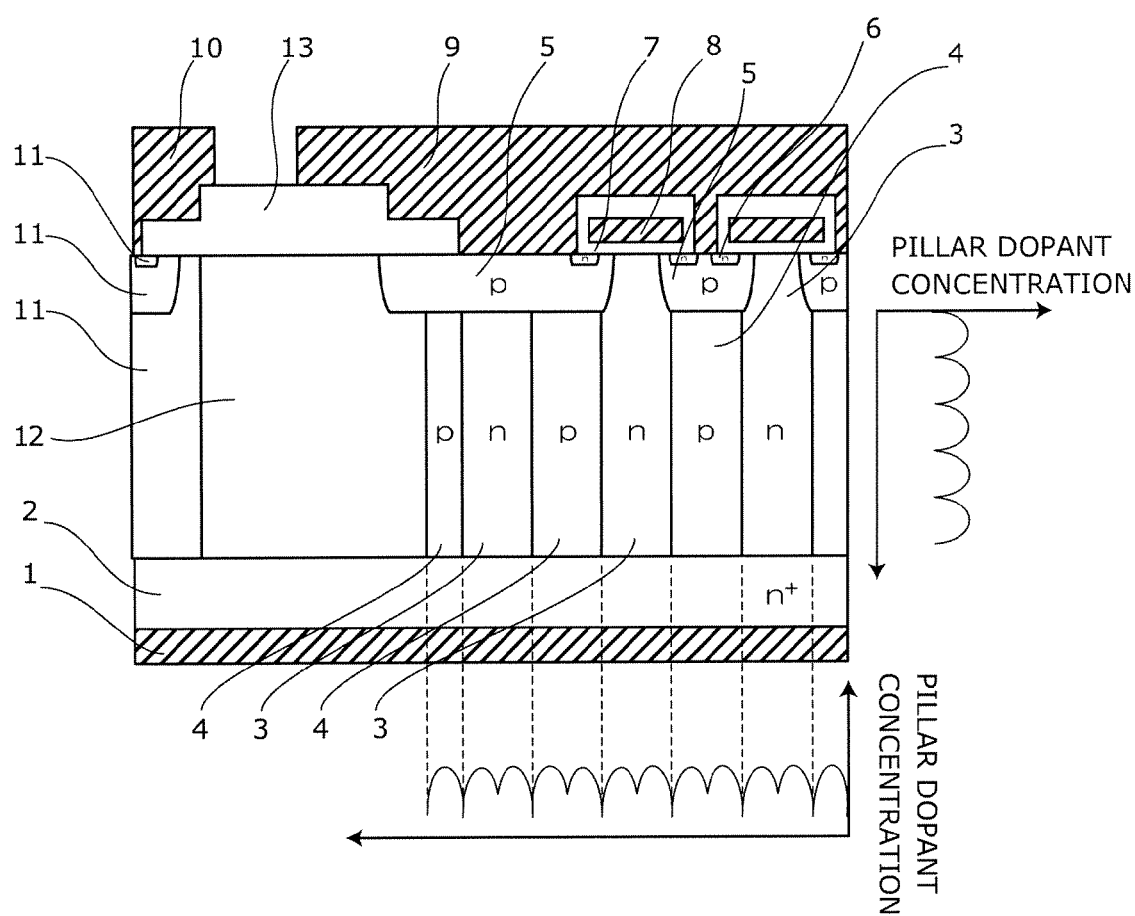
FIG. 8 is a cross-sectional view showing a vertical power MOSFET having a superjunction structure according to a second embodiment of the invention.

FIG. 8 is a cross-sectional view schematically showing the configuration of a power MOSFET according to a second embodiment of the invention. The same elements as those in FIG. 1 are not described in detail, but only different elements are described here.

Figure 9:
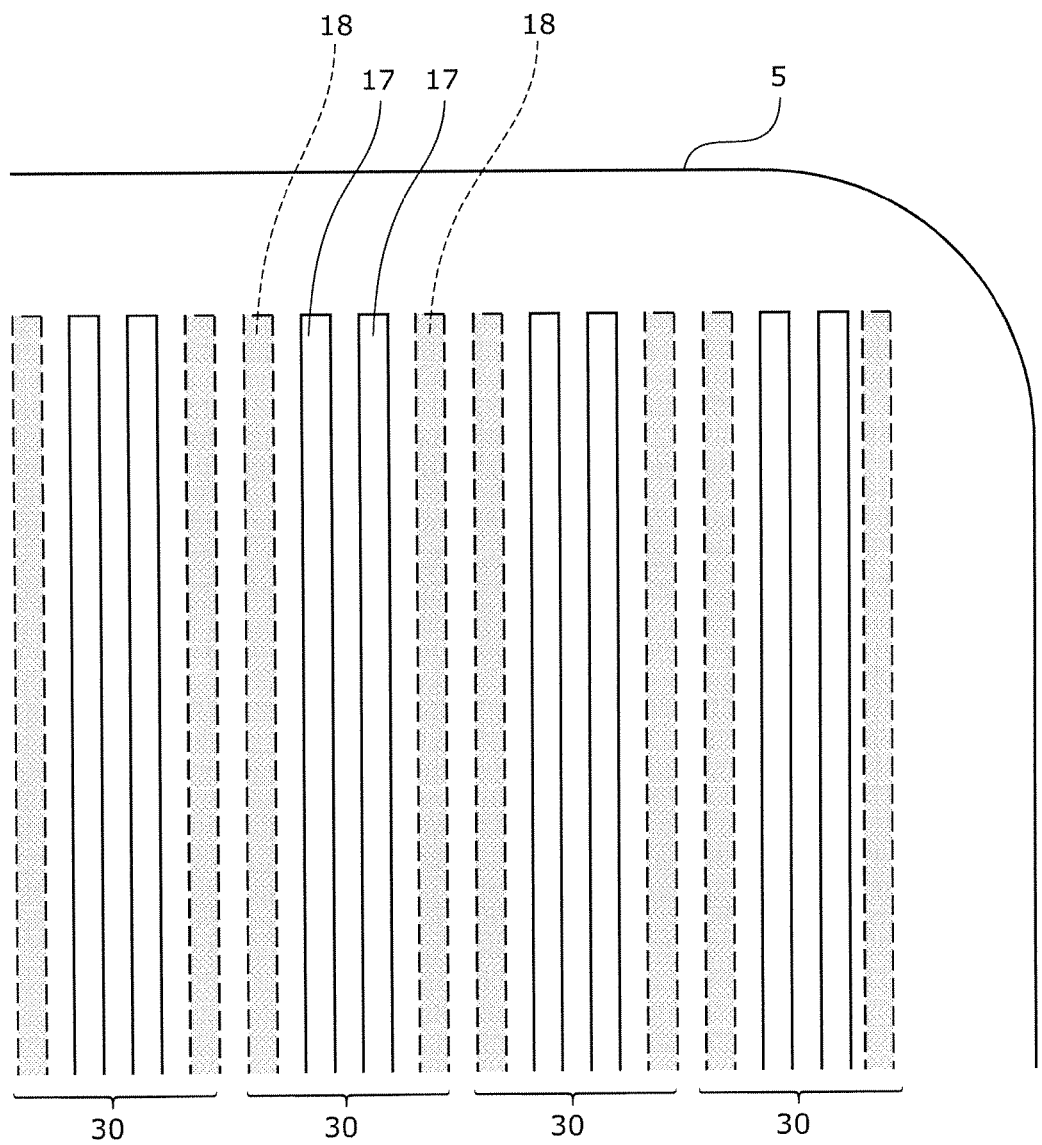
FIG. 9 shows a mask pattern for forming pillar layers of a vertical power MOSFET according to the second embodiment.

In the structure shown, the horizontal profile of the n-pillar layer 3 and the p-pillar layer 4 has a valley. This structure can be formed by using such a mask pattern as shown in FIG. 9. In this arrangement, two striped n-pillar layer openings 17 are sandwiched between two striped p-pillar layer openings 18.

In the pattern shown in FIGS. 3 and 4, one n-pillar layer opening 17 is arranged for every two p-pillar layer openings 18. Hence, for the amount of dopant in the p-pillar layer 4 to be equal to the amount of dopant in the n-pillar layer 3, it is necessary to double the mask opening width or the ion implantation dose amount. In contrast, in the pattern shown in FIG. 9, two n-pillar layer openings 17 are arranged for every two p-pillar layer openings 18. Hence, an equal opening width and implantation dose can be used, and the degree of dispersion can be made equal in the n-pillar layer 3 and in the p-pillar layer 4. Thus a stable breakdown voltage is readily achieved.

Third Embodiment

Figure 10:
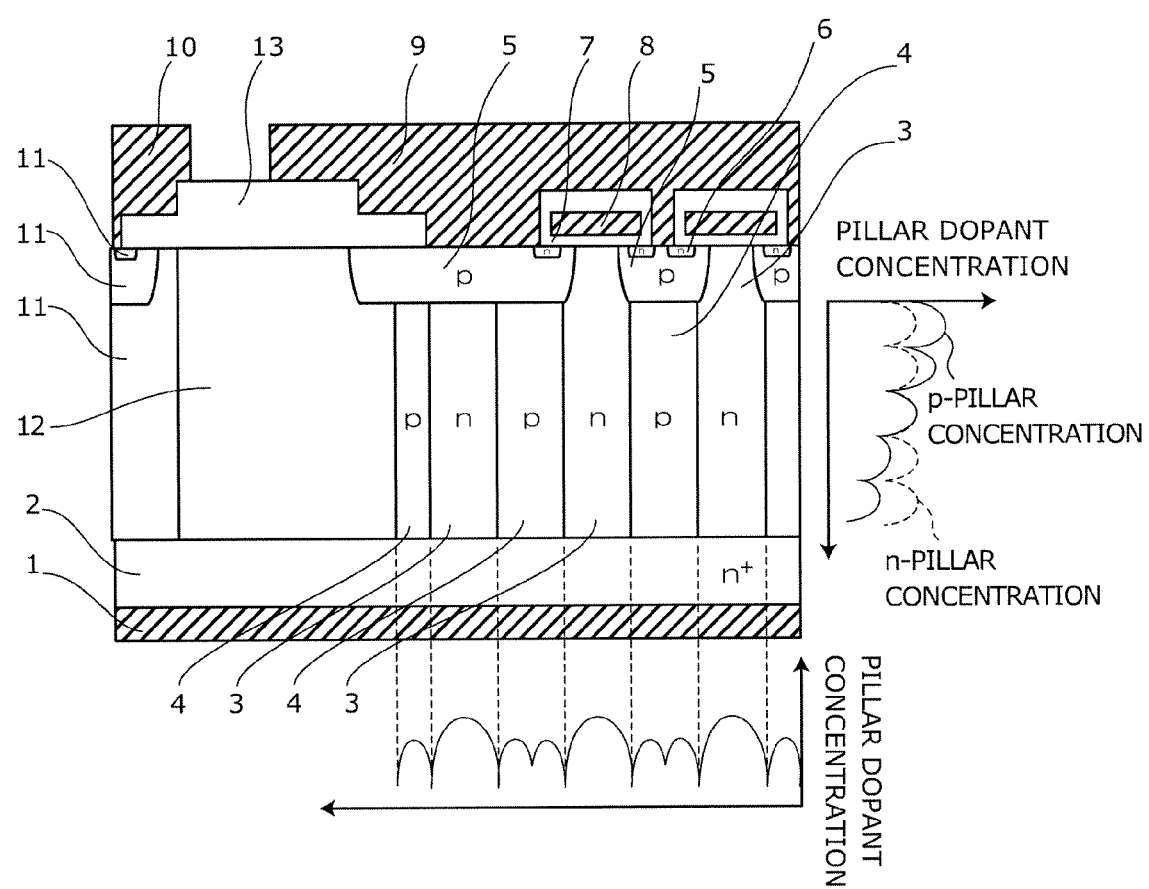
FIG. 10 is a cross-sectional view showing a vertical power MOSFET having a superjunction structure according to a third embodiment of the invention.

FIG. 10 is a cross-sectional view schematically showing the configuration of a power MOSFET according to a third embodiment of the invention. The same elements as those in the foregoing embodiments are not described in detail, but only different elements are described here.

In the structure shown, the vertical profile of the p-pillar layer 4 is varied. On the source electrode 9 side, the p-pillar layer 4 has a higher concentration than the n-pillar layer 3, whereas on the drain electrode side, the p-pillar layer 4 has a lower concentration. Such a vertical profile allows a stable breakdown voltage and a high avalanche withstanding capability to be achieved.

The decrease of breakdown voltage due to difference in the amount of dopant between the n-pillar layer 3 and the p-pillar layer 4 is smaller when the vertical concentration profile is sloped than when not sloped. Thus the decrease of breakdown voltage due to process dispersion can be reduced, and a stable breakdown voltage is achieved. Furthermore, because the electric field at the upper and lower end of the superjunction structure decreases, a high avalanche withstanding capability is achieved. If avalanche breakdown occurs, a large amount of carriers are generated in the drift layer, and the electric field at the upper and lower end of the drift layer increases. When the electric field at the upper and lower end of the drift layer exceeds a certain level, electric field concentration continues and produces negative resistance, which destroys the device. This determines the avalanche withstanding capability. By providing a sloped vertical profile to previously reduce the electric field at the upper and lower end, the occurrence of negative resistance is prevented, and a high avalanche withstanding capability can be achieved.

The structure shown can be formed by varying the ion implantation dose in each burying process. The electric field at the upper and lower end of the superjunction structure can be reduced when the amount of dopant in the p-pillar layer 4 is larger on the source side and smaller on the drain side than in the n-pillar layer 3. The figure shows the case where the amount of dopant in the p-pillar layer 4 is varied. However, the amount of dopant in the n-pillar layer 3 can be increased toward the drain side with the amount of dopant in the p-pillar layer 4 held constant. Furthermore, the amount of dopant can be varied in both the p-pillar layer 4 and the n-pillar layer 3.

Figure 11:
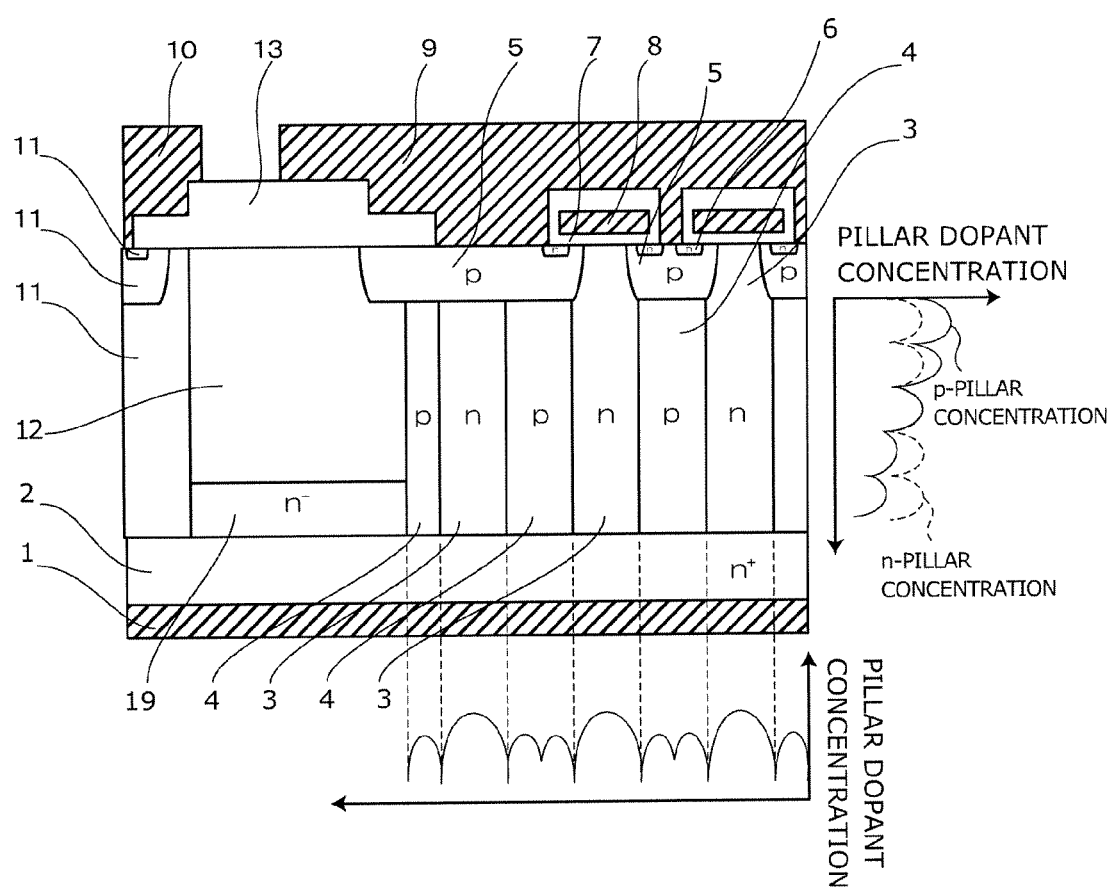
FIG. 11 is a cross-sectional view showing a vertical power MOSFET having a superjunction structure according to a modification of the third embodiment.
Figure 12:
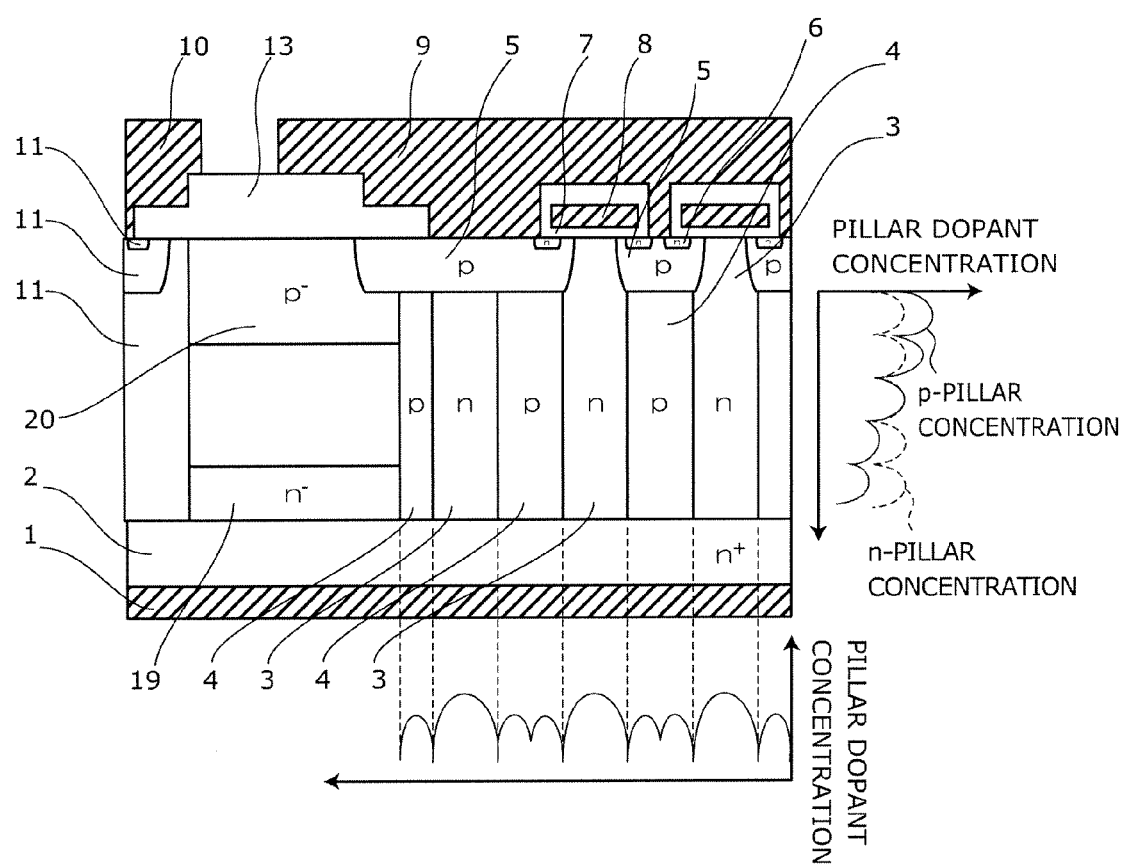
FIG. 12 is a cross-sectional view showing a vertical power MOSFET having a superjunction structure according to another modification of the third embodiment.

FIG. 11 shows a modification. In the structure shown, an $n^-$-layer 19 is formed on the $n^+$-drain layer 2 of the edge termination section, that is, under the high-resistance layer 12. In the structure shown in FIG. 10, the edge termination section is entirely occupied by the high-resistance layer 12. Hence the edge termination section has a higher breakdown voltage than the superjunction structure. However, when avalanche breakdown occurs upon application of a voltage above the breakdown voltage of the edge termination section, the electric field at the upper and lower end of the edge termination section is likely to increase, and negative resistance is likely to occur. Hence the avalanche withstanding capability of the edge termination section alone is low. In this context, by forming an $n^-$-layer 19 on the drain electrode side as shown in FIG. 11 to reduce the downside electric field, the avalanche withstanding capability can be enhanced. Furthermore, by forming a $p^-$-layer 20 in the surface of the source side of the edge termination section as shown in FIG. 12, the upside electric field in the drift layer can be reduced, and hence a higher avalanche withstanding capability can be achieved.

Preferably, the dopant concentration in the $n^-$-layer 19 and the $p^-$-layer 20 is about $\frac{1}{20}$ to $\frac{1}{4}$ of the dopant concentration in the n-pillar layer 3 and the p-pillar layer 4. Furthermore, the structure shown in FIGS. 11 and 12 can be formed by varying the dopant concentration in the buried growth layer. When the concentration in the growth layer is varied, the concentration in the pillar layer is also simultaneously varied. Hence the dopant concentration is automatically varied even if the ion implantation dose amount is not varied. The dose amount in the pillar layer can also be varied so that the concentration variation in the superjunction section is greater than the concentration variation in the edge termination section.

Fourth Embodiment

Figure 13:
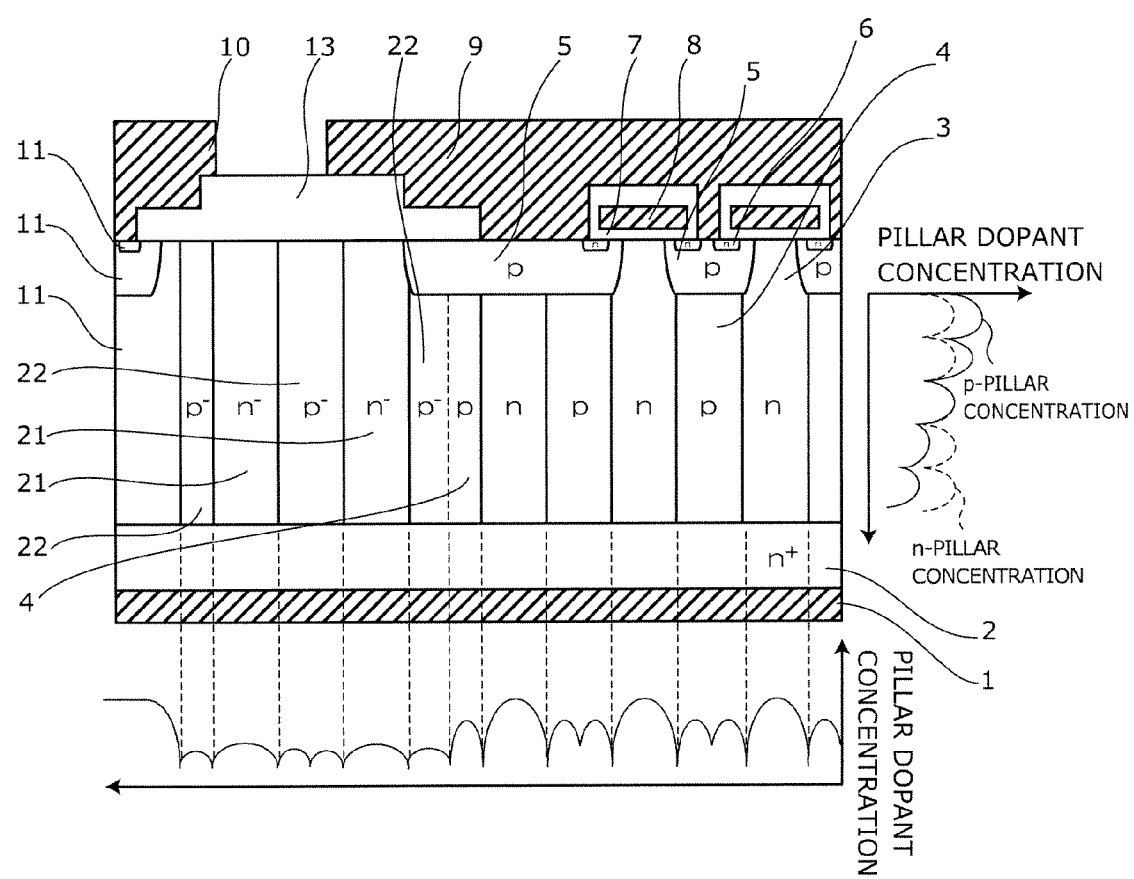
FIG. 13 is a cross-sectional view showing a vertical power MOSFET having a superjunction structure according to a fourth embodiment of the invention.

FIG. 13 is a cross-sectional view schematically showing the configuration of a power MOSFET according to a fourth embodiment of the invention. The same elements as those in the foregoing embodiments are not described in detail, but only different elements are described here.

In the structure shown, the superjunction structure is formed also in the edge termination section without the high-resistance layer in the edge termination section. As shown in the horizontal profile, the pillar layer of the superjunction structure in the edge termination section has a lower dopant concentration than in the cell section. Thus an edge termination breakdown voltage higher than the cell breakdown voltage can be achieved.

Figure 14:
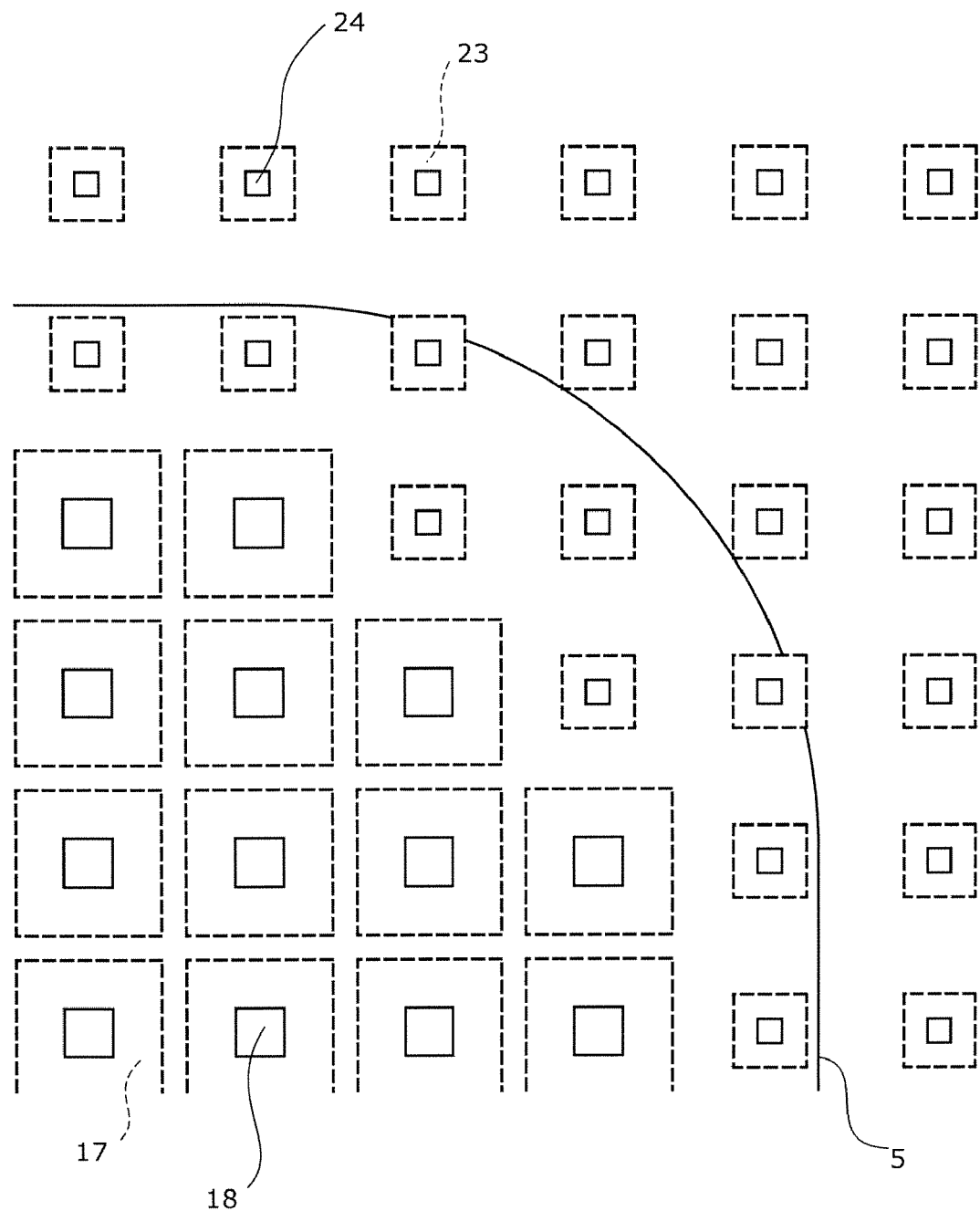
FIG. 14 shows a mask pattern for forming pillar layers of a vertical power MOSFET according to the fourth embodiment.

As described in the above embodiments, arrangement of a pattern using a basic unit of the superjunction allows the dopant concentration in the pillar layers of the cell section and the edge termination section to be independently controlled even if the superjunction structures in the cell section and the edge termination section are simultaneously formed. FIG. 14 illustrates a mask pattern for forming pillar layers. As shown, the dopant concentration in the pillar layer of the edge termination superjunction structure can be decreased by increasing the area of openings in the cell section and decreasing the area of openings in the edge termination section. Here, the ratio between the area of the n-pillar layer opening 17 and the area of the p-pillar layer opening 18 is made equal to the ratio between the area of the $n^-$-pillar layer opening 23 and the area of the $p^-$-pillar layer opening 24. Hence both superjunction structures can be formed without unbalancing the amount of dopant.

Furthermore, by forming the superjunction structure of the cell section simultaneously with the superjunction structure of the edge termination section, the vertical concentration profile of the pillar layer can be sloped as in the cell section. Hence the electric field at the upper and lower end of the drift layer decreases in both the cell section and the edge termination section even if the dopant concentration in the buried growth layer is not varied. Thus, high avalanche withstanding capability can be achieved. In the mask pattern shown in FIG. 14, p-pillar layers 3 and $p^-$-pillar layers 22 are arranged in a lattice configuration. However, a pattern having a striped or staggered configuration can also be used.

Fifth Embodiment

Figure 15:
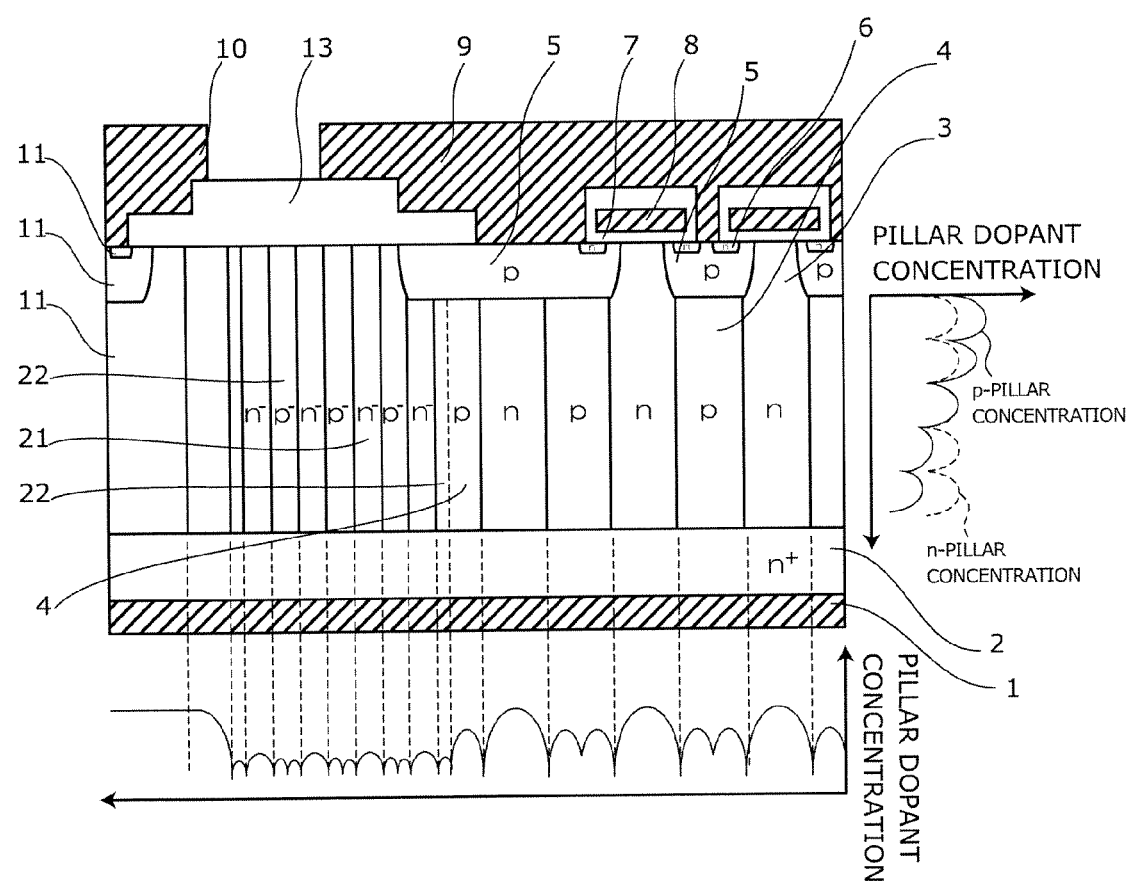
FIG. 15 is a cross-sectional view showing a vertical power MOSFET having a superjunction structure according to a fifth embodiment of the invention.

FIG. 15 is a cross-sectional view schematically showing the configuration of a power MOSFET according to a fifth embodiment of the invention. The same elements as those in the foregoing embodiments are not described in detail, but only different elements are described here.

In the structure shown, the superjunction structure is formed also in the edge termination section, and the superjunction structure in the edge termination section has a narrower horizontal period than in the cell section. By narrowing the horizontal period in the edge termination section, the superjunction structure of the edge termination section can be readily depleted, and the edge termination breakdown voltage increases.

Figure 16:
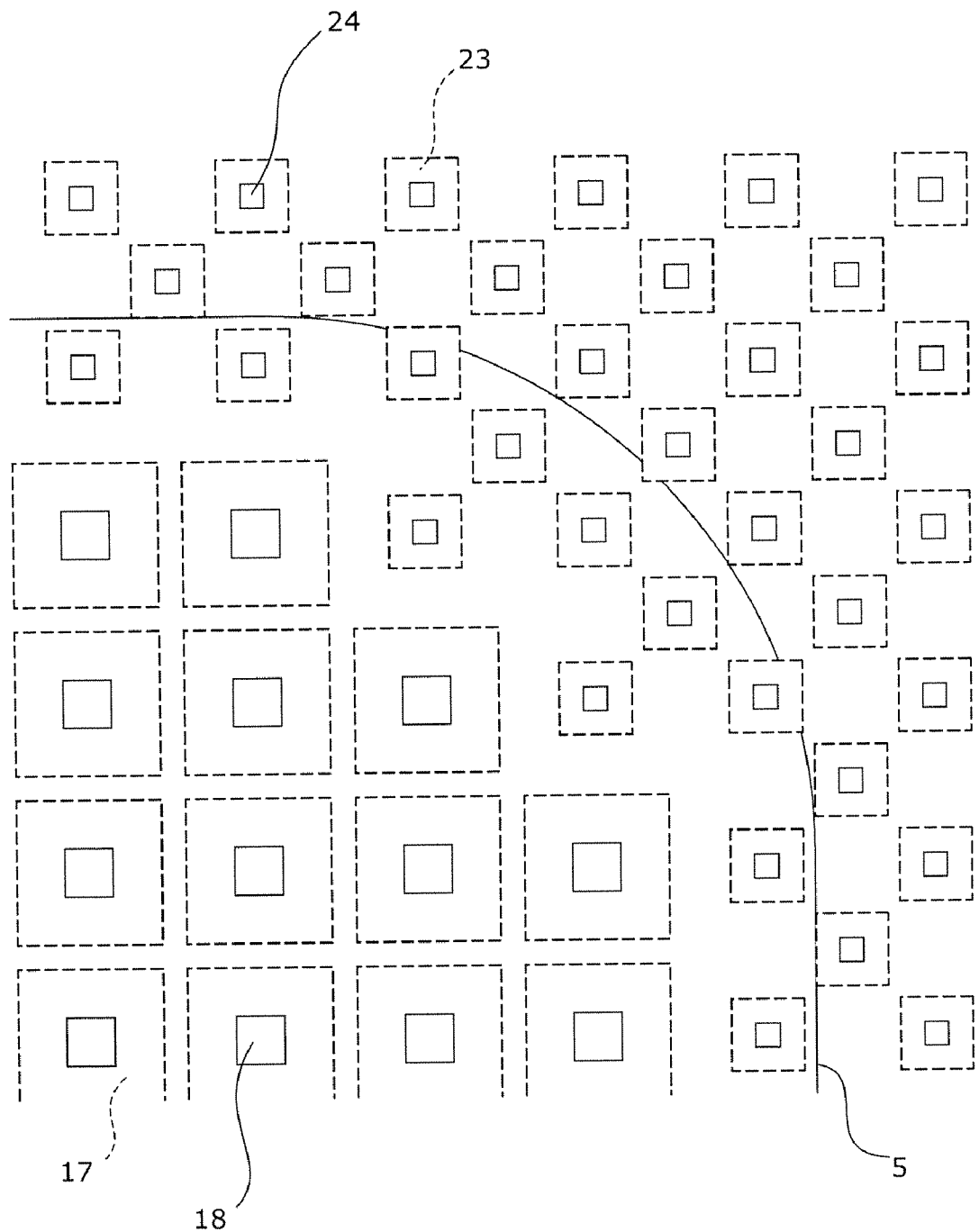
FIG. 16 shows a mask pattern for forming pillar layers of a vertical power MOSFET according to the fifth embodiment.

As described in the above embodiments, arrangement of a pattern using a basic unit of the superjunction also allows the horizontal period to be freely varied even if the superjunction structures in the cell section and the edge termination section are simultaneously formed. FIG. 16 illustrates a mask pattern. The $n^-$-pillar layer mask openings 23 and the $p^-$-pillar layer mask openings 24 for forming the superjunction structure of the edge termination section can be arranged with a reduced area and a narrowed pitch to form a structure shown in FIG. 15. While a staggered arrangement is shown in the edge termination section, a lattice arrangement can also be used. Furthermore, including the superjunction structure of the cell section, other patterns such as a striped configuration can also be used.

Sixth Embodiment

Figure 17:
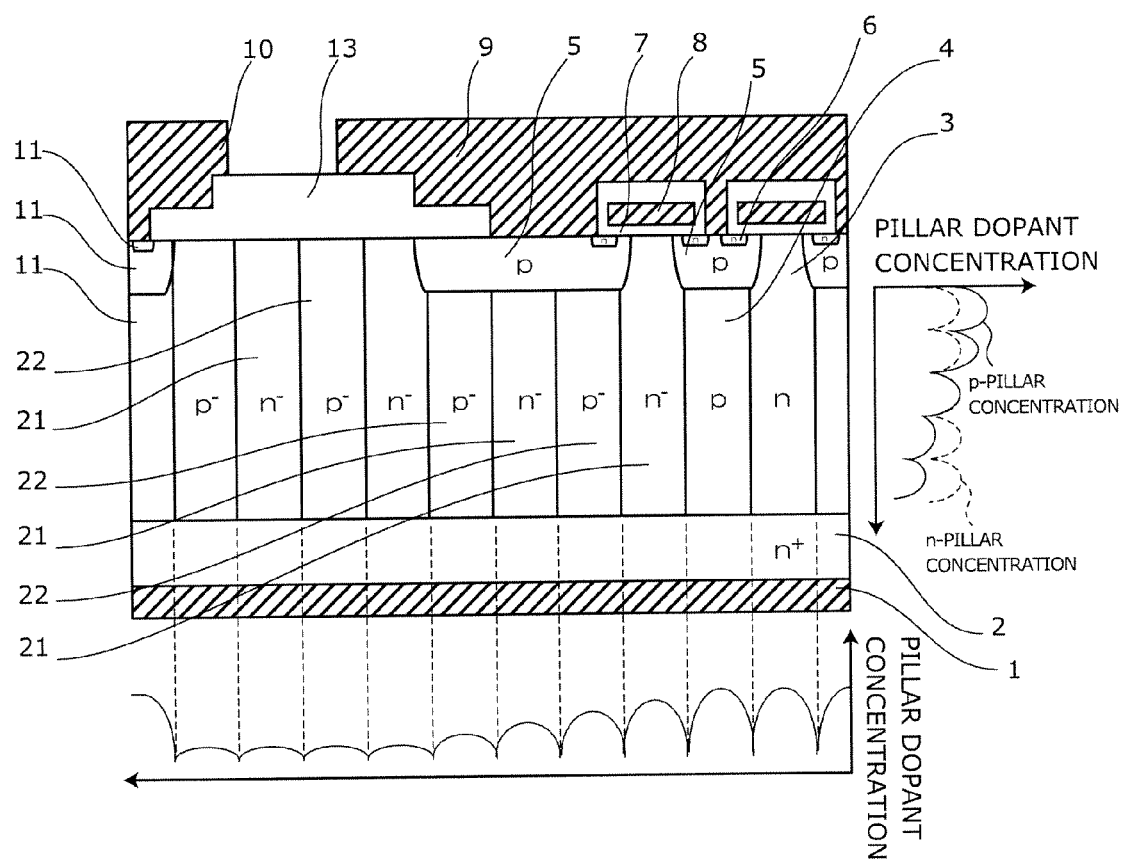
FIG. 17 is a cross-sectional view of the device structure of a vertical power MOSFET having a superjunction structure according to a sixth embodiment of the invention.

FIG. 17 is a cross-sectional view schematically showing the configuration of a power MOSFET according to a sixth embodiment of the invention. The same elements as those in the foregoing embodiments are not described in detail, but only different elements are described here.

In the structure shown, the superjunction structure is formed in both the cell section and the edge termination section. However, the pillar layer dopant concentration in the superjunction structure of the edge termination section gradually decreases outward and becomes constant. More specifically, the $n^-$-pillar layer 21 located nearest to the cell section side (n-pillar layer 3 side) has a higher dopant concentration than the other $n^-$-pillar layers 21, and the $p^-$-pillar layer 22 located nearest to the cell section side (p-pillar layer 4 side) has a higher dopant concentration than the other $p^-$-pillar layers 22. Such a stepwise variation of dopant concentration in the pillar layers prevents dispersion in local dopant concentration even if the mask pattern is not arranged using a basic unit. Thus, high breakdown voltage can be achieved.

In a gradually decreased dopant concentration in the pillar layers, when the concentration in the $n^-$-pillar layer 21 is the average of the concentrations in the two adjacent $p^-$-pillar layers 22, the dopant balance can be achieved between the $n^-$-pillar layer 21 and the $p^-$-pillar layer 22. To this end, the concentration variation in the $n^-$-pillar layers 21 and the concentration variation in the $p^-$-pillar layers 22 are preferably varied at a comparable slope. On the other hand, the region having a sloped concentration in the pillar layers is located generally directly below the outermost p-base layer 5. The outermost p-base layer 5 has a width of about 20 to 50 µm, for example. The position at which the concentration in the pillar layers begins to decrease from the center of the device toward the edge termination section may be located directly below the outermost p-base layer 5, or may be located more inside.

Figure 18:
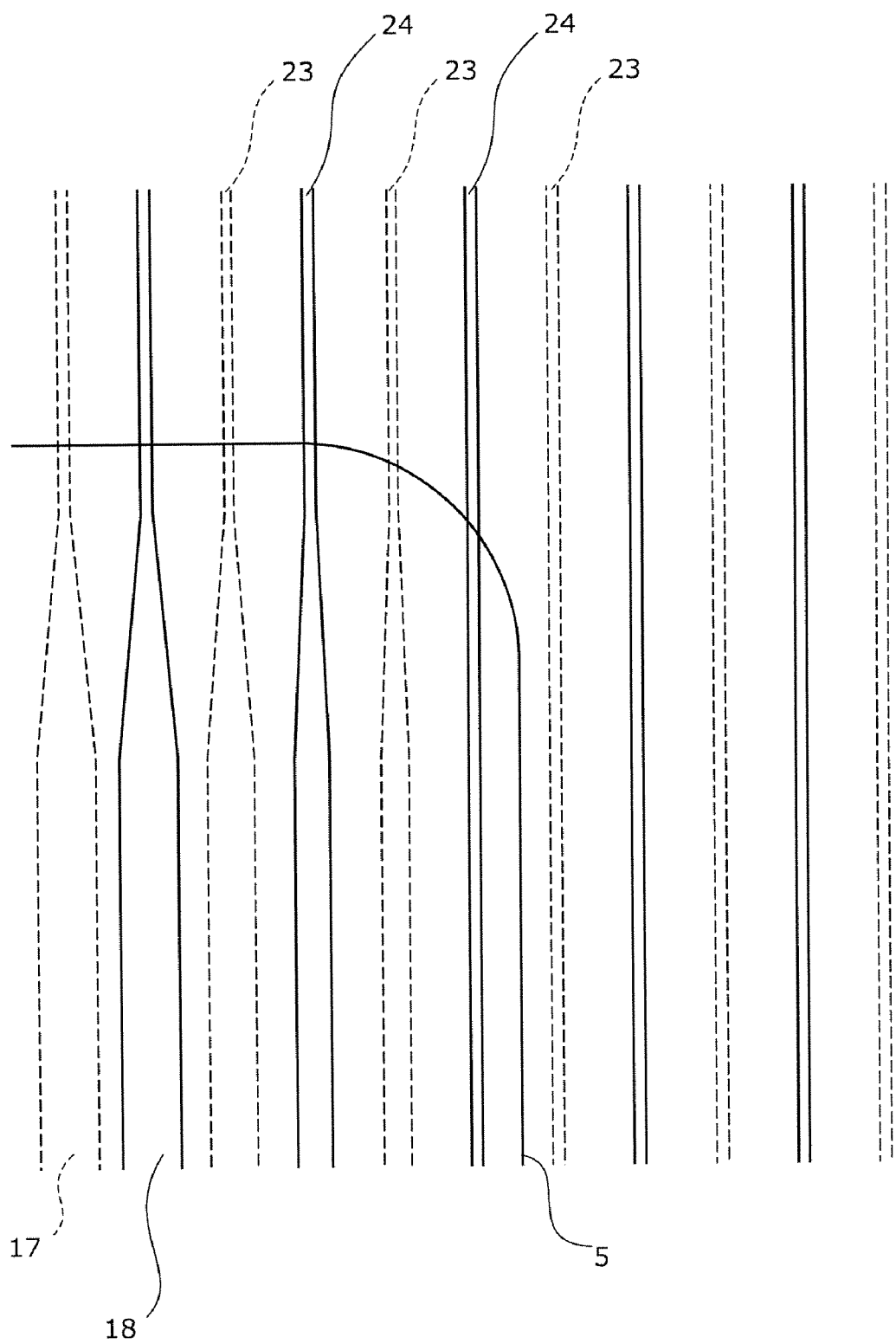
FIG. 18 shows a mask pattern for forming pillar layers of a vertical power MOSFET according to the sixth embodiment.

The structure shown in FIG. 17 can be formed by using a mask pattern as shown in FIG. 18, which illustrates a pattern where pillar layers are formed in a striped configuration. The pillar concentration can be gradually decreased by gradually narrowing the mask opening width with the horizontal period left unchanged.

The width of the $n^-$-pillar layer opening 23 and the width of the $p^-$-pillar layer opening 24 must be narrowed at a comparable slope so that the concentration in the $n^-$-pillar layer 21 is the average of the concentrations in the two adjacent $p^-$-pillar layers 22. For example, if the width of the $p^-$-pillar layer opening 24 is varied as 2 µm, 1.8 µm, 1.6 µm, and 1.4 µm, then the $n^-$-pillar layer opening 23 located therebetween must have a width of 1.9 µm, 1.7 µm, and 1.5 µm. Furthermore, for avoiding imbalance of the amount of dopant, variation of the width of the $p^-$-pillar layer opening 24 is preferably ended with the width of the $n^-$-pillar layer opening 23.

When the pillar layers are formed in a striped configuration, the opening width can be gradually narrowed also in the direction of extending stripes (stripe direction) to gradually decrease the pillar layer concentration with the horizontal period left unchanged. For avoiding imbalance of the amount of dopant also in the stripe direction, the width of the $p^-$-pillar layer opening 24 must be narrowed along with the width of the $n^-$-pillar layer opening 23. Such a two-dimensional size variation prevents the decrease of breakdown voltage even if misalignment occurs between buried doped layers. The length along which the opening width is varied in the stripe direction is determined so that misalignment can be neglected. This length is preferably longer than the pillar layer spacing in the direction of pillar layer arrangement (horizontal direction), particularly about 3 to 8 times the pillar layer spacing.

Such a continuous variation of mask opening width reduces its effect on the dispersion in opening width and facilitates achieving high breakdown voltage. Furthermore, because the concentration in both the p-pillar layer and the n-pillar layer is controlled by the ion implantation and the mask opening width, the breakdown voltage of the edge termination section can be increased without varying the horizontal period of the superjunction structure in the edge termination section.

When the concentration in both the p-pillar layer and the n-pillar layer is controlled by the ion implantation and the mask opening width, reducing the dopant concentration in the pillar layer of the edge termination section is more effective in preventing the decrease of breakdown voltage due to process dispersion than reducing the horizontal period. Reducing the pillar layer concentration and reducing the horizontal period are indeed both effective in facilitating depletion of the superjunction structure to increase the breakdown voltage. However, the dispersion in the mask opening width has a different degree of effect when the opening width is narrowed with the period left unchanged as compared with when the period is reduced with the opening width left unchanged.

When the mask opening width is narrowed with the period left unchanged, assuming that the dispersion in the opening width is constant irrespective of the dimensions, the dispersion in the amount of dopant in the buried doped layer is the same in the cell section and in the edge termination section. Because the decrease of breakdown voltage is proportional to the dispersion in the amount of dopant, the decrease of breakdown voltage from its maximum achieved in the balanced condition is the same in the cell section and in the edge termination section. Furthermore, the breakdown voltage of the edge termination section is made higher than the breakdown voltage of the cell section by reducing the concentration in the pillar layer. Hence, irrespective of process dispersion, there is no change in the relationship where the breakdown voltage of the cell section is lower than the breakdown voltage of the edge termination section.

On the other hand, when the period is reduced with the mask opening width left unchanged, the dispersion in the mask opening width of each pillar layer is not changed. Hence the dispersion in the amount of dopant in each pillar layer is the same in the cell section and in the edge termination section. However, because the period is narrowed in the edge termination section, the horizontally averaged dispersion in the amount of dopant increases in inverse proportion to the period. That is, when the period is decreased by half, the dispersion in the amount of dopant is doubled. Consequently, the maximum breakdown voltage is higher in the edge termination section than in the cell section. However, when the process dispersion increases, the breakdown voltage becomes lower in the edge termination section than in the cell section. That is, the edge termination section suffers from a significant decrease of breakdown voltage.

Thus, with regard to the effect of enhancing the maximum breakdown voltage, the structure having a gradually varied concentration with the period left unchanged according to this embodiment is the same as the structure having a gradually narrowed period with the concentration left unchanged as disclosed in JP 2001-298190A. However, the decrease of breakdown voltage due to process dispersion is smaller in the structure of this embodiment.

Furthermore, as in the structure shown in FIG. 14, by simultaneously forming the superjunction structure in the cell section and in the edge termination section, the vertical profile in both thereof can be sloped, and a high avalanche withstanding capability can be achieved.

Figure 19:
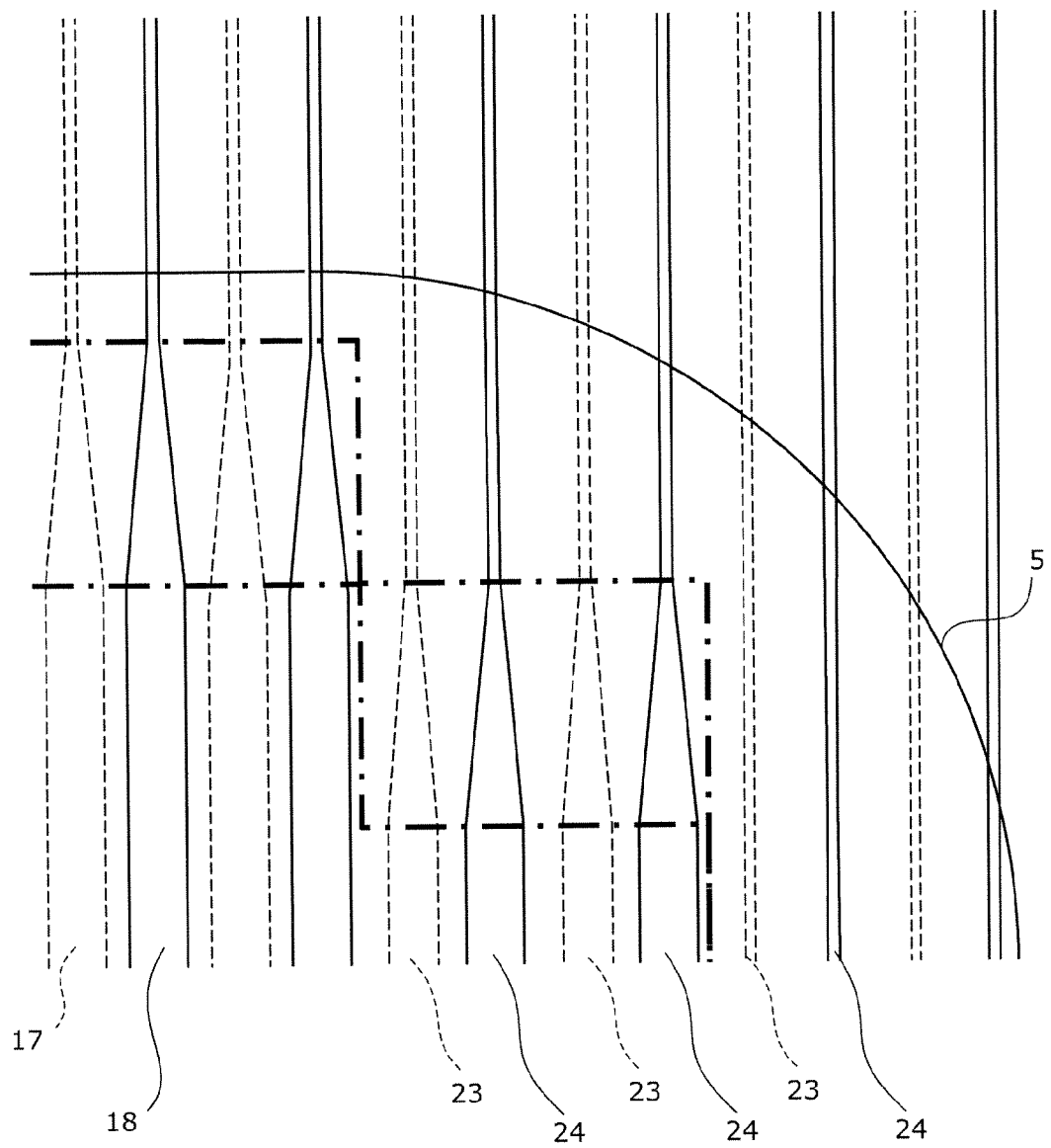
FIG. 19 shows a mask pattern for forming pillar layers of a vertical power MOSFET according to a modification of the sixth embodiment.

Because the corner of the cell section is susceptible to electric field concentration, it is preferable to decrease the pillar layer concentration in the superjunction structure below the corner. Hence, varying the superjunction structure stepwise as in FIG. 4 to vary the width of the pillar layer without decreasing the effective area is effective in simultaneously achieving low ON resistance and high breakdown voltage. FIG. 19 illustrates a pattern. In the regions enclosed by the dot-dashed line, the opening width is gradually varied. Such a stepwise arrangement of the varied regions allows the superjunction structure at the corner to have a reduced concentration without decreasing the effective area.

Thus, according to this embodiment, the dopant concentration in the p-pillar layer and in the n-pillar layer is decreased from the cell section toward the edge termination section, that is, in the direction to the outside of the device. Here, the concentration is varied not rapidly, but gradually, thereby preventing the effect of concentration dispersion due to process dispersion. Thus, high breakdown voltage can be realized.

JP 2001-298190A discloses a structure where the horizontal period of the superjunction structure is varied by gradually varying the width of the pillar layer with the pillar layer concentration held constant. This structure can be formed by multiple repetition of the process of ion implantation of p-type dopant and buried crystal growth with an n-type semiconductor layer. Here, because the n-pillar layer concentration is determined by the dopant concentration in the n-type growth layer, the horizontal concentration profile is difficult to control. Thus, for the amount of dopant contained in the p-pillar layer to be equal to the amount of dopant contained in the n-pillar layer, the mask opening width and the opening position must be simultaneously varied during ion implantation for forming the p-pillar layer. Furthermore, because the amount of p-type dopant used for ion implantation needs to be sufficient to cancel the dopant in the n-type growth layer, the dose amount in ion implantation is increased. Thus the decrease of breakdown voltage is likely to occur due to the deformation of the resist pattern and the dispersion in dose amount.

In contrast, when the superjunction structure is formed by a process of repeating a plurality of times ion implantation of both p-type and n-type dopants and buried crystal growth with a low-doped layer, the effect of process dispersion can be reduced. In this process, like the dopant concentration in the p-pillar layer, the dopant concentration in the n-pillar layer is also controlled by the ion implantation and the mask opening width. Hence the pillar layer concentration can be reduced by decreasing only the width of the mask opening for forming pillar layers of the edge termination section. Thus the superjunction structure of the edge termination section is completely depleted at a lower voltage than the superjunction structure of the cell section, and high breakdown voltage is achieved. Absence of n-type growth layer results in decreasing the dose amount during ion implantation for forming p-pillar layers. Thus the decrease of breakdown voltage is prevented even if the mask opening width or the dose amount is dispersed. Furthermore, as illustrated in this embodiment, the effect of process dispersion is decreased by gradually varying the opening width to reduce the pillar layer concentration stepwise.

Seventh Embodiment

Figure 20:
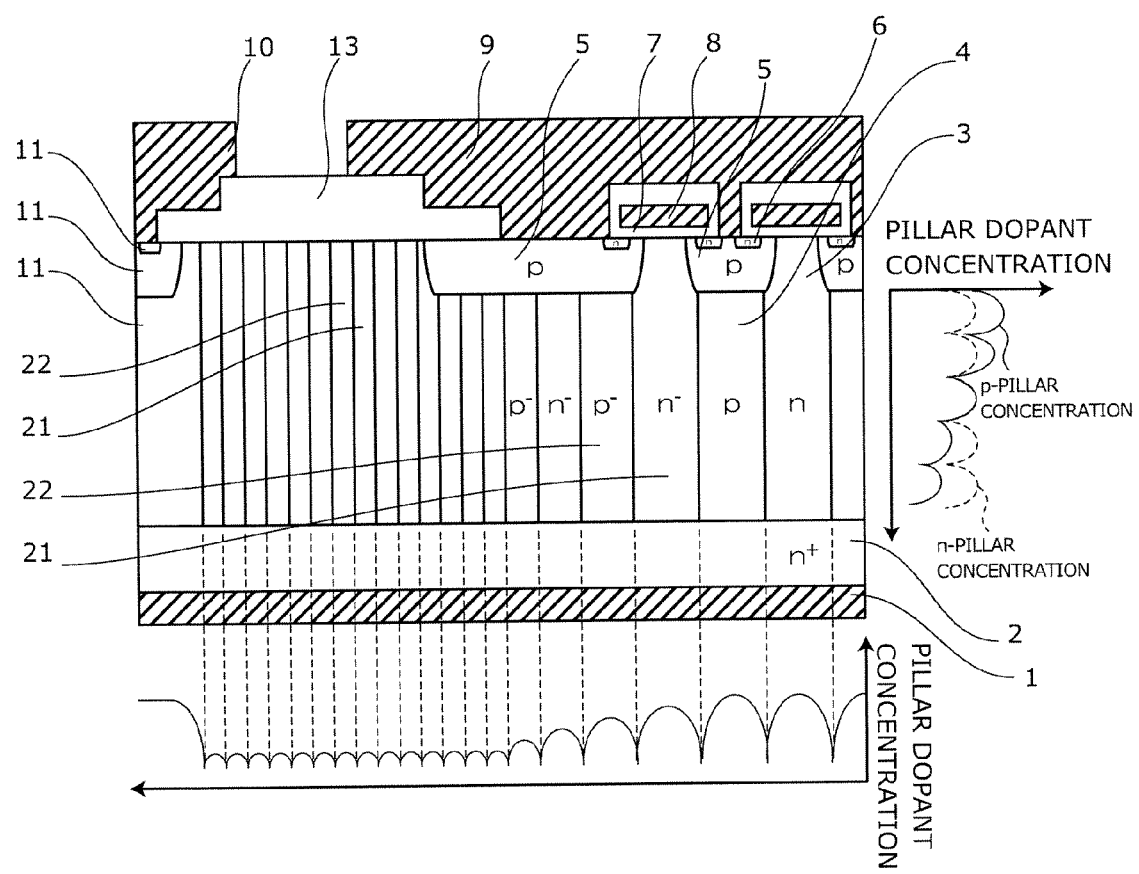
FIG. 20 is a cross-sectional view showing a vertical power MOSFET having a superjunction structure according to a seventh embodiment of the invention.

FIG. 20 is a cross-sectional view schematically showing the configuration of a power MOSFET according to a seventh embodiment of the invention. The same elements as those in the foregoing embodiments are not described in detail, but only different elements are described here.

Figure 21:
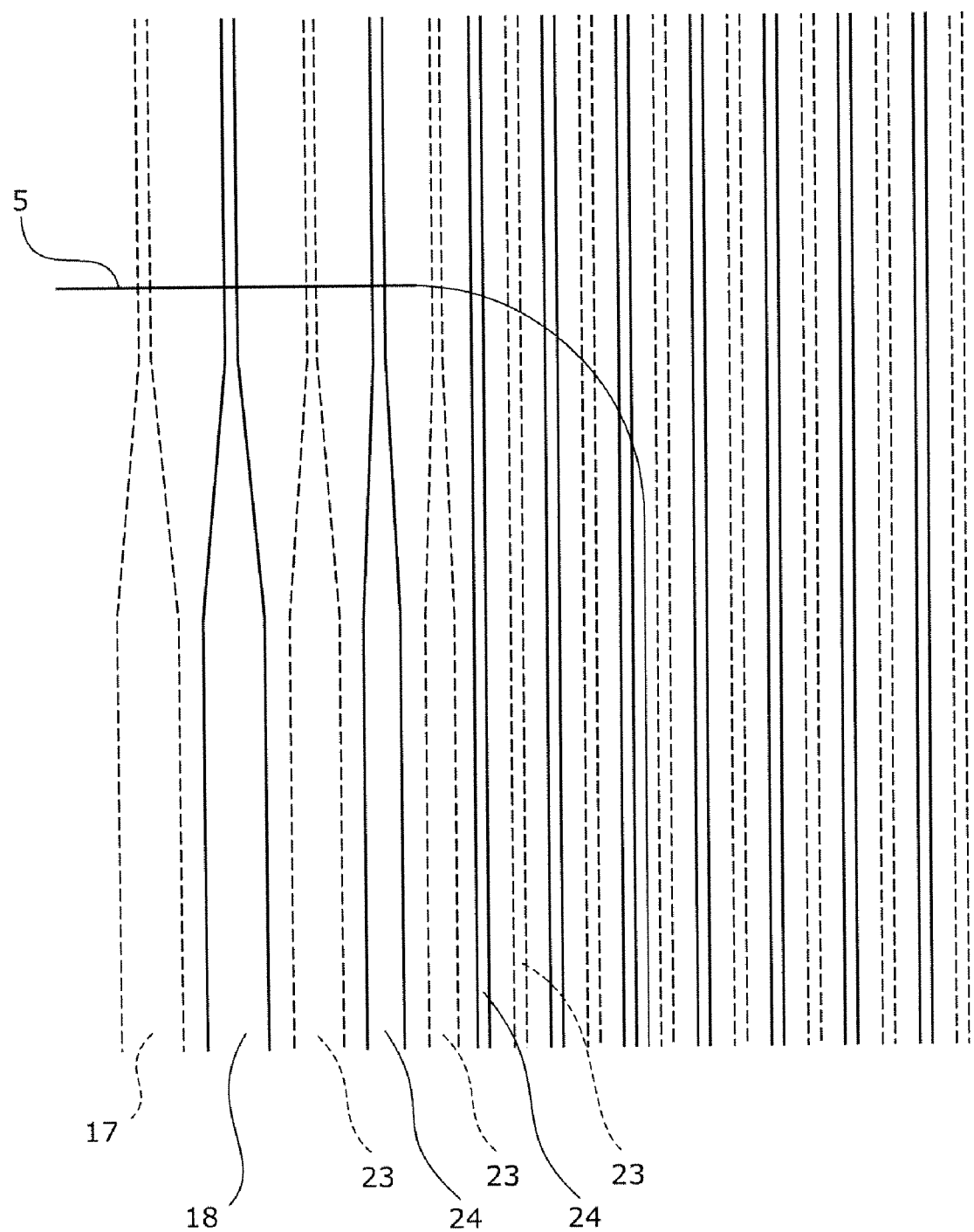
FIG. 21 shows a mask pattern for forming pillar layers of a vertical power MOSFET according to the seventh embodiment.

In the structure shown, the concentration and period of the superjunction structure of the edge termination section are simultaneously varied, both gradually. As described above, when the period is narrowed, the decrease of breakdown voltage due to process dispersion is likely to occur. However, the maximum breakdown voltage is increased by the narrowed period. Thus the breakdown voltage can be increased in the edge termination section than in the cell section. Consequently, the decrease of breakdown voltage due to process dispersion can be prevented. This structure can be formed by using a mask pattern as shown in FIG. 21.

Eighth Embodiment

Figure 22:
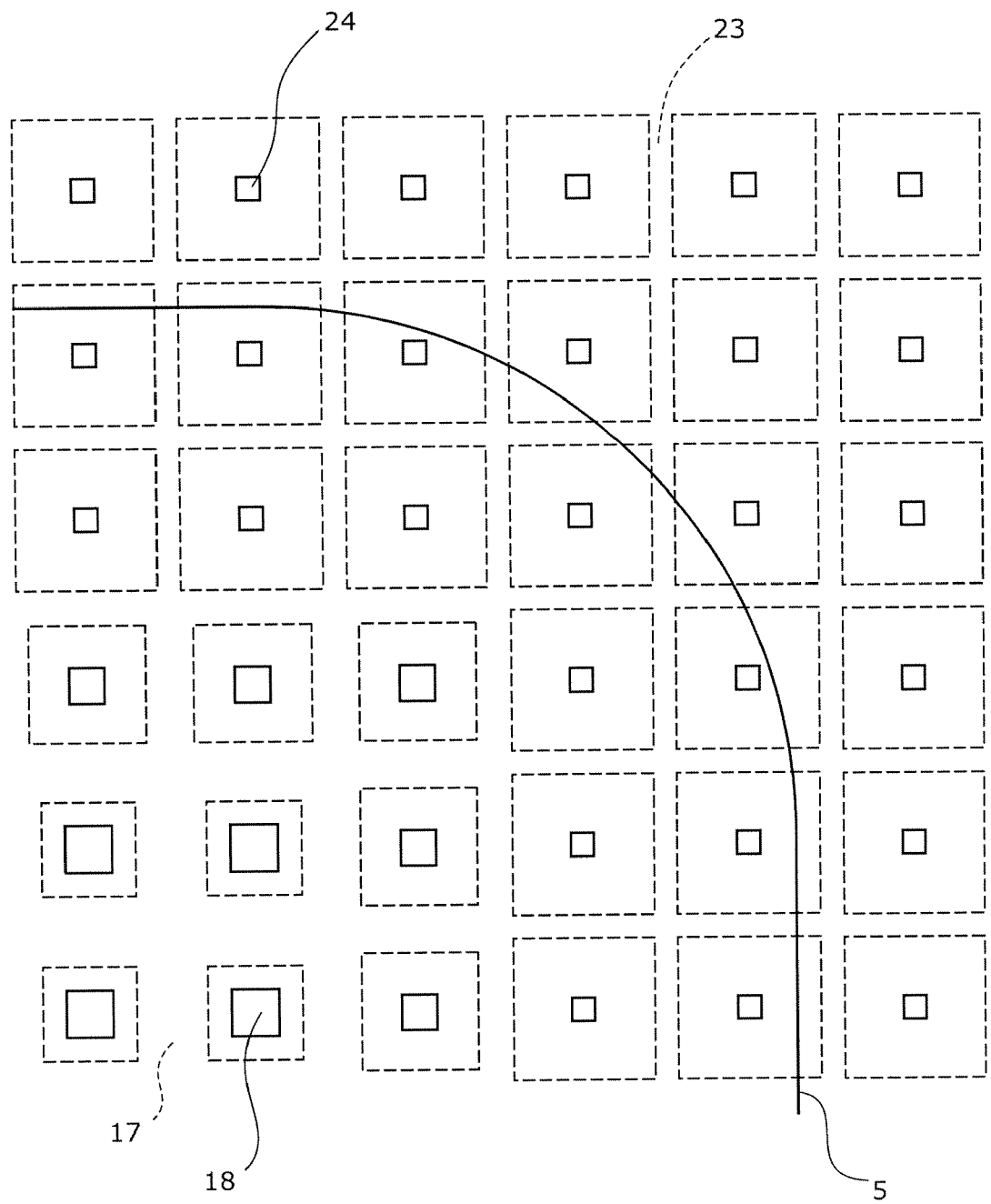
FIG. 22 shows a mask pattern for forming pillar layers of a vertical power MOSFET having a superjunction structure according to an eighth embodiment of the invention.

FIG. 22 is a plan view schematically showing a mask pattern for forming a power MOSFET according to an eighth embodiment of the invention. The same elements as those in the foregoing embodiments are not described in detail, but only different elements are described here.

In the pattern illustrated in the figure, p-pillar layer openings 18 and p$^-$-pillar layer openings 24 are arranged in a matrix configuration. Furthermore, n-pillar layer openings 17 and n$^-$-pillar layer openings 23 are provided in a lattice configuration so as to surround and to be spaced from the p-pillar layer openings 18 and the p$^-$-pillar layer openings 24. The opening width of the p-pillar layer opening 18 and the n-pillar layer opening 17 is gradually decreased from the center of the device toward the edge termination section both vertically and horizontally. Thus the pillar layer concentration is gradually reduced from the center of the device toward the edge termination section. In the pattern shown in FIG. 22, p-pillar layer openings 18 and p$^-$-pillar layer openings 24 are arranged in a matrix configuration. However, a pattern with a staggered arrangement can also be used.

Figure 23:
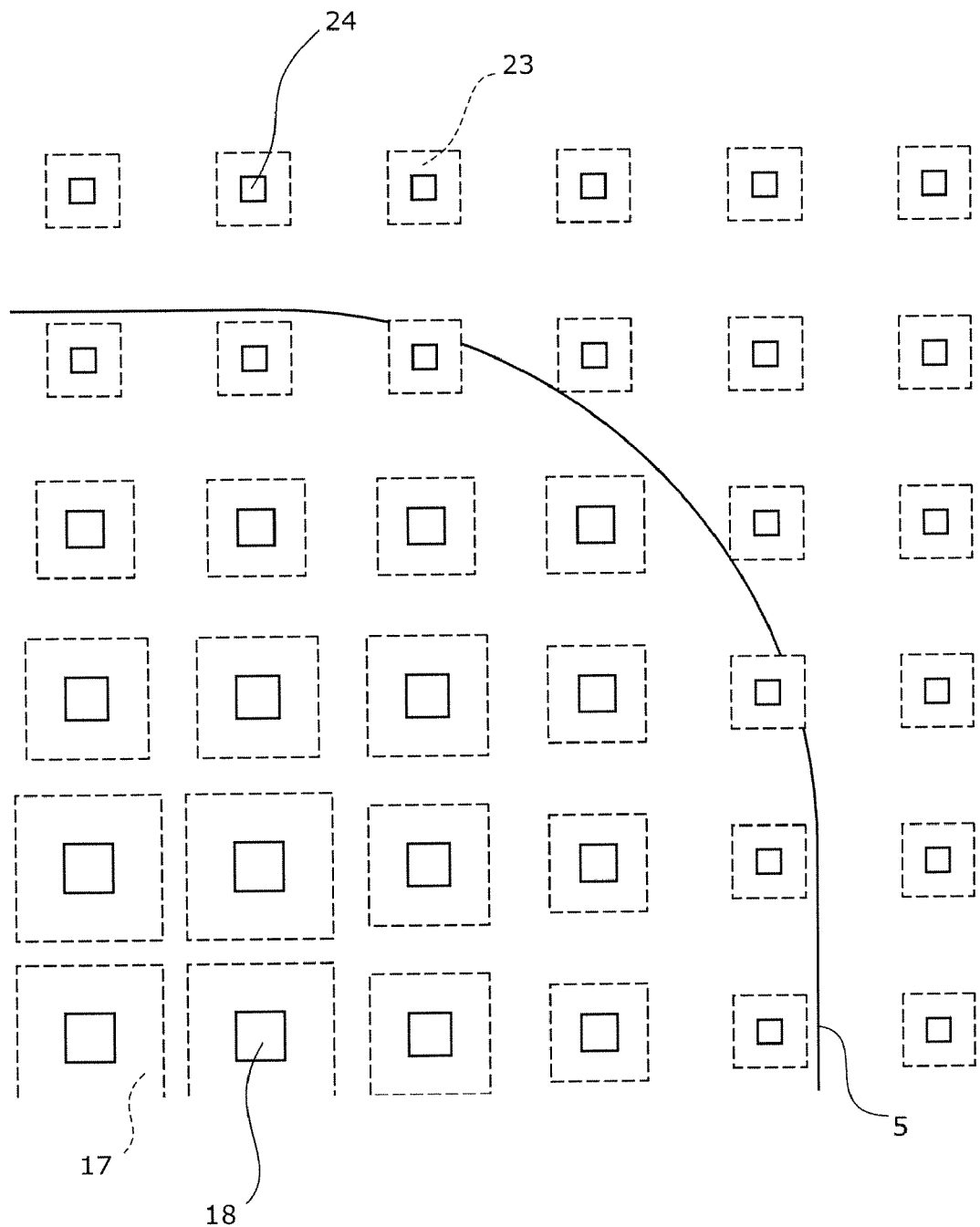
FIG. 23 shows a mask pattern for forming pillar layers of a vertical power MOSFET according to a modification of the eighth embodiment.
Figure 24:
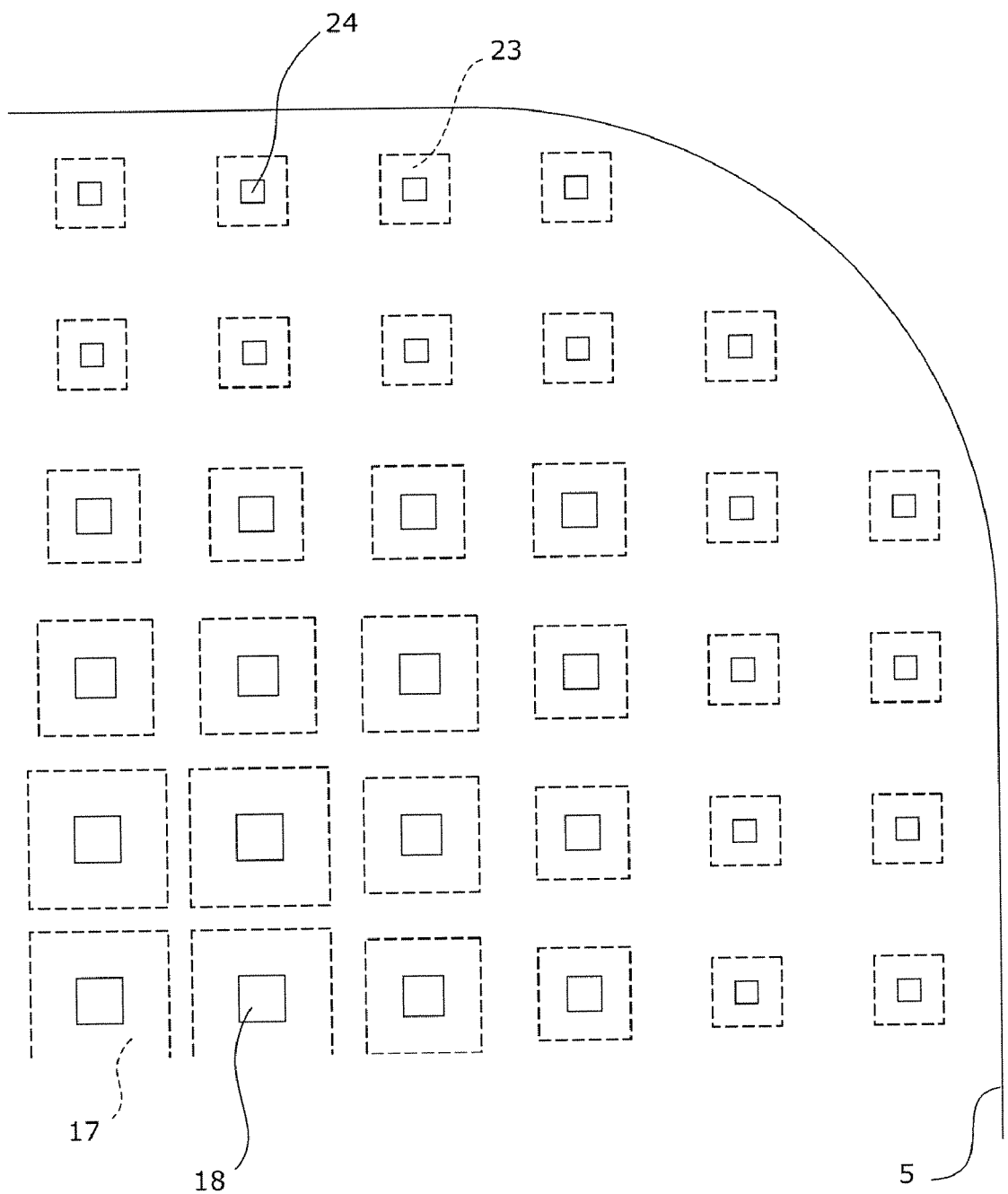
FIG. 24 shows a mask pattern for forming pillar layers of a vertical power MOSFET according to another modification of the eighth embodiment.

Furthermore, even if the pattern is arranged using a basic unit as illustrated in the fourth embodiment, the opening width can be gradually decreased to prevent the effect of vertical misalignment for each buried layer. Thus, high breakdown voltage can be readily achieved. FIG. 23 illustrates a pattern where p-pillar layer openings 18 are arranged in a matrix configuration. However, a pattern with a striped or staggered arrangement can also be used. Furthermore, as shown in FIG. 24, it is also possible to use a pattern where the basic unit is gradually reduced in the cell and the superjunction structure is not formed in the edge termination section.

Ninth Embodiment

Figure 25:
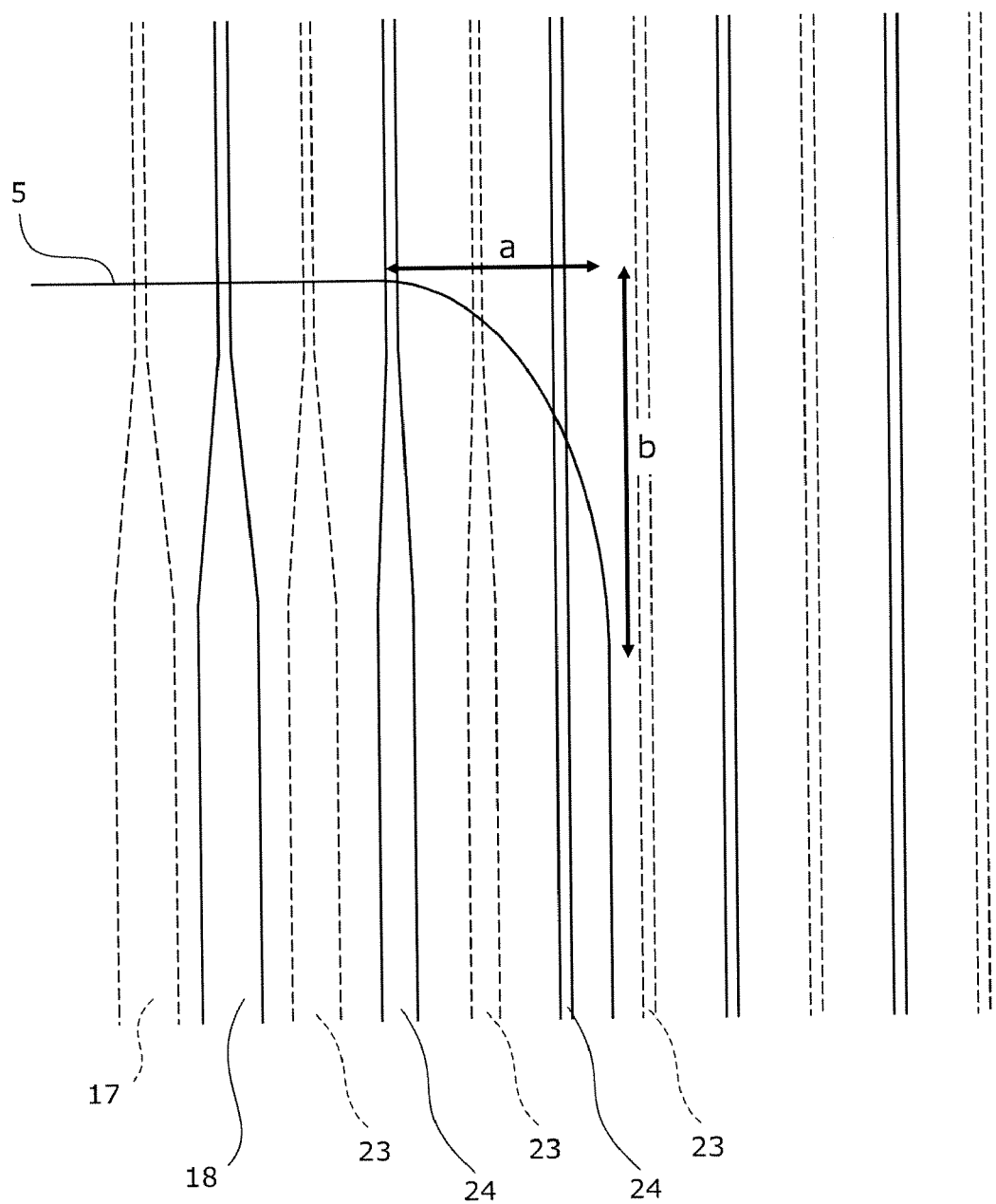
FIG. 25 shows a mask pattern for forming pillar layers of a vertical power MOSFET having a superjunction structure according to a ninth embodiment of the invention.

FIG. 25 is a plan view schematically showing a mask pattern for forming a power MOSFET according to a ninth embodiment of the invention. The same elements as those in the foregoing embodiments are not described in detail, but only different elements are described here.

Figure 26:
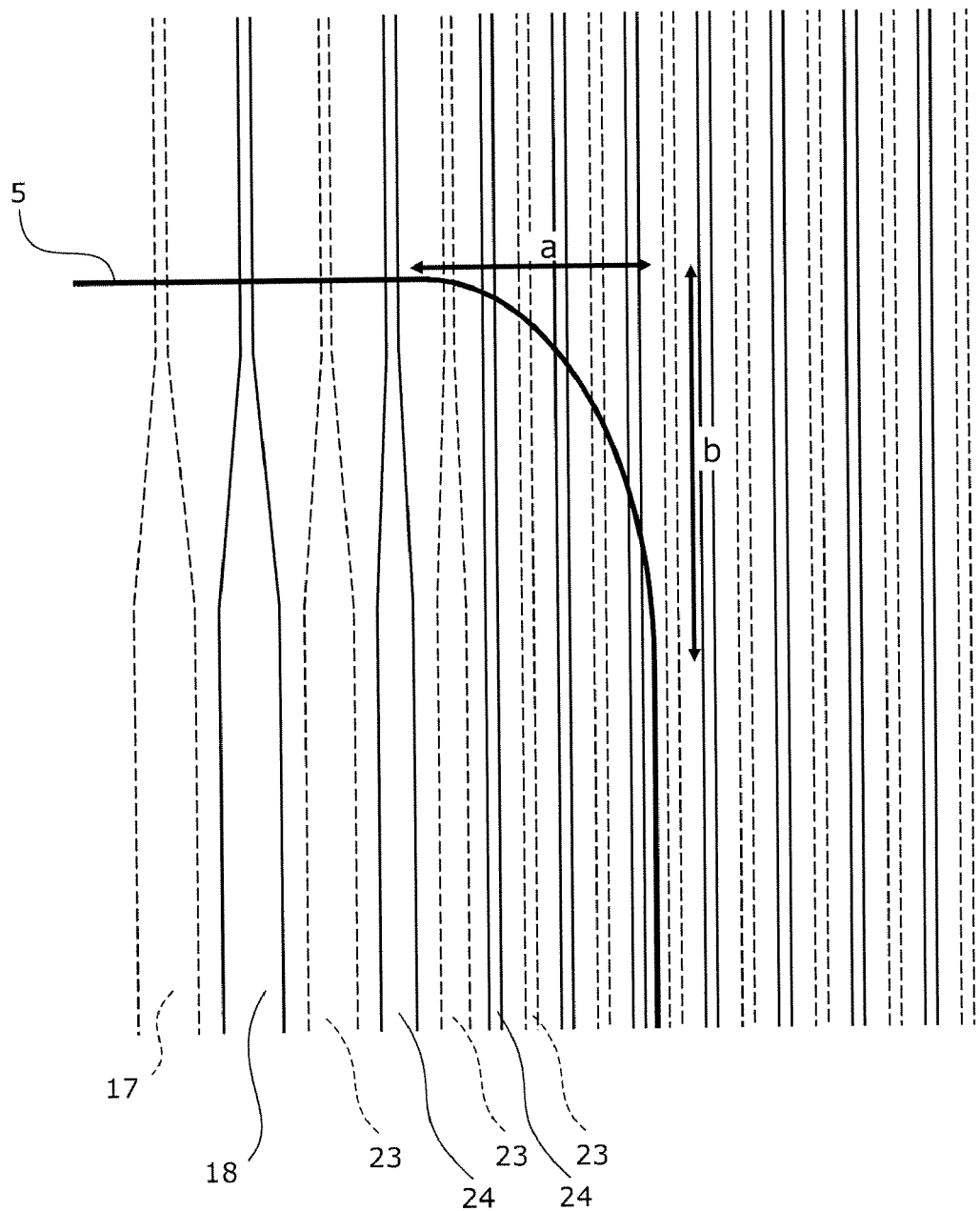
FIG. 26 shows a mask pattern for forming pillar layers of a vertical power MOSFET according to a modification of the ninth embodiment.

In the pattern illustrated in FIG. 25, the superjunction structure is formed in a striped configuration as in FIG. 18. FIG. 25 is different from FIG. 18 in the curvature at the corner of the p-base layer 5. When the superjunction structure is formed in a striped configuration, the depletion layer is easy to extend in the direction of extending stripes (stripe direction), and difficult to extend in the arranging direction of the stripe. Hence, electric field concentration is likely to occur not at the center of the corner, but in the portion having a direction similar to the arranging direction of the stripe. Thus, preferably, the curvature radius of the corner is long in the arranging direction and short in the stripe direction (a<b in the figure). This embodiment is also applicable to the case where the pillar layer spacing in the edge termination section is reduced as shown in FIG. 26.

Various aspects of the invention have been illustrated with reference to the first to ninth embodiments. However, the invention is not limited to these embodiments. For example, the above embodiments assume the first conductivity type as n-type and the second conductivity type as p-type. However, it is also possible to assume the first conductivity type as p-type and the second conductivity type as n-type. Furthermore, in the first to ninth embodiments, a p-pillar layer is formed in the outermost portion of the device section. However, an n-pillar layer can be used instead to achieve an equivalent effect by using a similar design. Furthermore, the planar pattern of the MOS gate portion and the superjunction structure is not limited to a striped configuration, but can be formed in a lattice or staggered configuration, as in the pillar pattern of the superjunction structure.

The surface of the edge termination section is illustrated as a structure based on a field plate structure. However, a RESURF structure, a guard ring structure, a floating field plate structure and the like can also be used, and the invention is not limited to such surface structures. Furthermore, the MOS gate structure is illustrated as a planar structure. However, a trench structure can also be used.

The p-pillar layer 4 and the p$^-$-pillar layer 22 may have no contact with the n$^+$-drain layer 2. In FIG. 2, the superjunction structure is formed by ion implantation into the substrate surface where a high-resistance layer is grown. Hence the p-pillar layer 4 is in contact with the n$^+$-drain layer 2. However, an n-type semiconductor layer can be grown on the n$^+$-drain layer 2 to form a structure where the p-pillar layer has no contact with the n$^+$-drain layer. Furthermore, the superjunction structure can be formed on a substrate surface where an n$^-$-layer having a lower concentration than the n-pillar layer 3 is grown.

The high-resistance layer 12 may be other than a perfect intrinsic semiconductor. High breakdown voltage can be achieved if the dopant concentration is sufficiently low relative to the n-pillar layer 3. However, the dopant concentration in the high-resistance layer 12 is preferably 1/10 or less of the dopant concentration in the n-pillar layer 3. Furthermore, the high-resistance layer 12 is preferably of n-type so that the electric field is higher on the device cell side rather than on the device outer periphery.

In the embodiments illustrated above, the step of forming a high-resistance layer and the step of implanting p-type and n-type dopants into this high-resistance layer are repeated a plurality of times, and then the dopants are diffused to form n-pillar layers and p-pillar layers. However, the invention is not limited thereto. For example, after the high-resistance layer is formed, dopants can be implanted into this high-resistance layer under a plurality of levels of acceleration voltages, followed by diffusion of the dopants. Also in this case, dopant regions distributed in the depth direction can be formed in the high-resistance layer. Thus, n-pillar layers and p-pillar layers extending in the thickness direction can be formed.

In the MOSFETs described above, silicon (Si) is used as a semiconductor. However, the semiconductor can illustratively be any one of silicon carbide (SiC), gallium nitride (GaN), and other compound semiconductors, and diamond and other wide bandgap semiconductors.

The first to ninth embodiments described above can be combined with each other as long as technically feasible. Such combinations of the above embodiments are also encompassed within the scope of the invention. Furthermore, any design modifications and component additions to the above embodiments and combinations thereof are also encompassed within the scope of the invention.

In the above embodiments, a MOSFET is illustrated as a power semiconductor device having a superjunction structure. However, the power semiconductor device according to the invention is not limited to MOSFETs. The structure according to the invention is also applicable to any devices having a superjunction structure, such as a SBD (Schottky Barrier Diode), a hybrid device of MOSFETs and SBDs, a SIT (Static Induction Transistor), and an IGBT (Insulated Gate Bipolar Transistor). For example, the above embodiments can be applied to an IGBT if a p-layer for supplying holes is formed between the drain electrode 1 and the n$^+$-drain layer 2.

The invention claimed is:

1. A power semiconductor device having a cell section for passing current and an edge termination section surrounding the cell section, the power semiconductor device comprising:
   a first semiconductor layer of a first conductivity type;
   a plurality of alternating second and third semiconductor layers formed on the first semiconductor layer of the first conductivity type in the cell section and alternately arranged along at least one direction parallel to a surface of the first semiconductor layer of the first conductivity type, each second semiconductor layer being of the first conductivity type and each third semiconductor layer being of a second conductivity type;
   a plurality of alternating seventh and eighth semiconductor layers formed on the first semiconductor layer of the first conductivity type in the edge termination section and alternately arranged along the one direction, each seventh semiconductor layer being of the first conductivity type and each eighth semiconductor layer being of the second conductivity type;

a first main electrode electrically connected to the first semiconductor layer of the first conductivity type;

a fourth semiconductor layer of the second conductivity type selectively formed through a surface of the second semiconductor layer of the first conductivity type and a surface of the third semiconductor layer of the second conductivity type;

a fifth semiconductor layer of the first conductivity type selectively formed through a surface of the fourth semiconductor layer of the second conductivity type;

a second main electrode connected to the fourth semiconductor layer of the second conductivity type and the fifth semiconductor layer of the first conductivity type; and a control electrode formed above the fourth semiconductor layer of the second conductivity type, the fifth semiconductor layer of the first conductivity type, and the second semiconductor layer of the first conductivity type via a gate insulating film, in a region including a boundary between the cell section and the edge termination section and including three or more consecutively arranged second, third, seventh and eight semiconductor layers, dopant concentration in each of the three or more consecutively arranged second, third, seventh and eight semiconductor layers being successively decreased in each consecutive of the three or more consecutively arranged second, third, seventh and eight semiconductor layer as each of the three or more consecutively arranged second, third, seventh and eight semiconductor layers is located nearer to the edge termination section, in the region, in which three third, second and third semiconductor layers are consecutively arranged in a first order, the dopant concentrations of said three third, second and third semiconductor layers in said first order being such that the second semiconductor layer of said first order is substantially equal to an average of the dopant concentrations of adjoining two third semiconductor layers of said first order, and in which three eighth, seventh and eighth semiconductor layers are consecutively arranged in a second order, the dopant concentration of the seventh semiconductor layer of said second order is substantially equal to an average of the dopant concentrations of adjoining two eighth semiconductor layers of said second order.

2. The power semiconductor device according to claim 1, wherein the cell section has an outer periphery curved at a corner of the cell section as viewed from above, and the second semiconductor layer of the first conductivity type and the third semiconductor layer of the second conductivity type are shaped along the outer periphery of the cell section.

3. The power semiconductor device according to claim 1, wherein the dopant concentration of the second semiconductor layer of the first conductivity type and the dopant concentration of the third semiconductor layer of the second conductivity type varies along a direction from the first main electrode toward the second main electrode, at a side of the second main electrode, the dopant concentration of the third semiconductor layer of the second conductivity type is higher than the dopant concentration of the second semiconductor layer of the first conductivity type, and at a side of the first main electrode, the dopant concentration of the second semiconductor layer of the first conductivity type is higher than the dopant concentration of the third semiconductor layer of the second conductivity type.

4. The power semiconductor device according to claim 3, wherein a periodicity of arrangement of the second semiconductor layer of the first conductivity type and the third semiconductor layer of the second conductivity type is equal to a periodicity of arrangement of the seventh semiconductor layer of the first conductivity type and the eighth semiconductor layer of the second conductivity type.

5. The power semiconductor device according to claim 3, wherein a periodicity of arrangement of the second semiconductor layer of the first conductivity type and the third semiconductor layer of the second conductivity type is greater than a periodicity of arrangement of the seventh semiconductor layer of the first conductivity type and the eighth semiconductor layer of the second conductivity type.

6. The power semiconductor device according to claim 3, wherein the second semiconductor layer of the first conductivity type, the third semiconductor layer of the second conductivity type, the seventh semiconductor layer of the first conductivity type and the eighth semiconductor layer of the second conductivity type are formed in a shape of stripe.

7. The power semiconductor device according to claim 6, further comprising:

another seventh semiconductor layer of the first conductivity type formed on the extension of the second semiconductor layer of the first conductivity type; and another eighth semiconductor layer of the second conductivity type formed on the extension of the third semiconductor layer of the second conductivity type, the dopant concentration of the other seventh semiconductor layer of the first conductivity type being lower than the dopant concentration of the second semiconductor layer of the first conductivity type and the dopant concentration of the other eighth semiconductor layer of the second conductivity type being lower than the dopant concentration of the third semiconductor layer of the second conductivity type, and the dopant concentration of the second semiconductor layer of the first conductivity type and the other seventh semiconductor layer of the first conductivity type gradually changing along a length direction of the stripe at a boundary domain between the cell section and the edge termination section, and the dopant concentration of the third semiconductor layer of the second conductivity type and the other eighth semiconductor layer of the second conductivity type gradually changing along the length direction at the boundary domain.

8. The power semiconductor device according to claim 6, wherein a periodicity of arrangement of the seventh semiconductor layer of the first conductivity type and the eighth semiconductor layer of the second conductivity type is smaller than a periodicity of arrangement of the second semiconductor layer of the first conductivity type and the third semiconductor layer of the second conductivity type at a part of the edge termination section, the part being in a direction vertical to the length direction of the stripe.

9. The power semiconductor device according to claim 1, wherein the third semiconductor layer of the second conductivity type and the eighth semiconductor layer of the second conductivity type are arranged in a matrix configuration or in a staggered configuration.

* * * * *